United States Patent
Je et al.

(10) Patent No.: US 8,524,381 B2
(45) Date of Patent: Sep. 3, 2013

(54) ORGANOMETALLIC COMPLEX FOR ORGANIC LIGHT-EMITTING LAYER AND ORGANIC LIGHT-EMITTING DIODE USING THE SAME

(75) Inventors: Jong-Tae Je, Cheongju-si (KR); Hyun-Jung Kwon, Cheongju-si (KR); Sang-Hae Lee, Daejeon (KR)

(73) Assignee: SFC Co., Ltd. (KR)

( * ) Notice: Subject to any disclaimer, the term of this patent is extended or adjusted under 35 U.S.C. 154(b) by 103 days.

(21) Appl. No.: 13/009,592

(22) Filed: Jan. 19, 2011

(65) Prior Publication Data

US 2011/0108827 A1    May 12, 2011

Related U.S. Application Data

(63) Continuation-in-part of application No. 11/683,403, filed on Mar. 7, 2007, now abandoned.

(30) Foreign Application Priority Data

Mar. 7, 2006 (KR) .................. 10-2006-0021278
Feb. 28, 2007 (KR) .................. 10-2007-0020638

(51) Int. Cl.
*H01L 51/54*      (2006.01)
*C07F 5/06*      (2006.01)

(52) U.S. Cl.
USPC ............ 428/690; 428/917; 546/7; 313/504; 313/506

(58) Field of Classification Search
None
See application file for complete search history.

(56) References Cited

U.S. PATENT DOCUMENTS

| | | | |
|---|---|---|---|
| 3,172,862 A | 3/1965 | Gurnee et al. | |
| 3,173,050 A | 3/1965 | Gurnee | |

(Continued)

FOREIGN PATENT DOCUMENTS

| | | |
|---|---|---|
| JP | 11-40355 | 2/1999 |
| WO | WO 2005/014551 | * 2/2005 |

OTHER PUBLICATIONS

Sergey Lamansky et al., "Synthesis and Characterization of Phosphorescent Cyclometalated Iridium Complexes," Inorg. Chem. vol. 40, 2001, pp. 1704-1711.

(Continued)

*Primary Examiner* — Dawn Garrett
(74) *Attorney, Agent, or Firm* — Cantor Colburn LLP

(57) ABSTRACT

An organometallic complex represented by Formula 1 is provided. An organic light-emitting diode using the organometallic complex exhibits improved current and power efficiency and long lifetime.

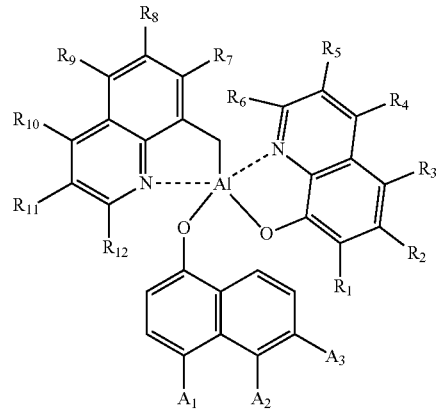

(1)

10 Claims, 6 Drawing Sheets

| |
|---|
| 80 |
| 70 |
| 60 |
| 50 |
| 40 |
| 30 |
| 20 |
| 10 |

(56) References Cited

U.S. PATENT DOCUMENTS

| | | |
|---|---|---|
| 6,656,608 B1 | 12/2003 | Kita et al. |
| 7,230,107 B1 * | 6/2007 | Herron et al. ............ 546/7 |
| 2003/0068528 A1 | 4/2003 | Thompson et al. |
| 2003/0072964 A1 | 4/2003 | Kwong et al. |
| 2003/0129452 A1 | 7/2003 | Tsuji et al. |
| 2006/0063031 A1 | 3/2006 | Brown et al. |
| 2007/0048544 A1 * | 3/2007 | Brown et al. ............ 428/690 |
| 2007/0054148 A1 * | 3/2007 | Matsuo et al. ............ 428/690 |
| 2009/0216018 A1 * | 8/2009 | Herron et al. ............ 546/7 |

OTHER PUBLICATIONS

Sergey Lamansky et al., "Highly Phosphorescent Bis-Cyclometalated Iridium Complexes: Synthesis, Photophysical Characterization, and Use in Organic Light Emitting Diodes," J. Am. Chem. Soc. vol. 123, 2001, pp. 4304-4312.

C. W. Tang et al., "Organic electroluminescent diodes," Appln. Phys. Lett., vol. 51, No. 12, Sep. 21, 1987, pp. 913-915.

C.W. Tang et al., "Electroluminescence of doped organic thin films," J. Appl. Phys., vol. 85, No. 9, May 1, 1989, pp. 3610-3616.

* cited by examiner

ORGANOMETALLIC COMPLEX FOR ORGANIC LIGHT-EMITTING LAYER AND ORGANIC LIGHT-EMITTING DIODE USING THE SAME

This application is a continuation-in-part application of U.S. patent application Ser. No. 11/683,403 filed on Mar. 7, 2007, which claims Korean Patent Application Nos. 10-2006-0021278 and 10-2007-0020638 filed on Mar. 7, 2006 and Feb. 28, 2007, the contents of which in its entirety are hereby incorporated by reference.

BACKGROUND

1. Field of the Invention

The present invention relates to an organometallic complex for an organic light-emitting layer. More specifically, the present invention relates to an organometallic complex for an organic light-emitting layer that can be used to fabricate an organic light-emitting diode with high efficiency and long lifetime, and an organic light-emitting diode with high efficiency and long lifetime using the organometallic complex.

2. Description of the Related Art

As displays have become larger in size in recent years, there is an increasing demand for flat panel display devices that take up as little space as possible. Liquid crystal display devices as representative flat panel display devices can be reduced in weight when compared to the prior art cathode ray tubes (CRTs), but have several disadvantages in that the viewing angle is limited, the use of back light is inevitably required, etc. Organic light-emitting diodes (OLEDs) as a novel type of flat panel display devices are self-emissive display devices. Organic light-emitting diodes have a large viewing angle, and are advantageous in terms of light weight, small thickness, small size and rapid, response time when compared to liquid crystal display devices.

A representative organic light-emitting diode was reported by Gurnee in 1969 (U.S. Pat. Nos. 3,172,862 and 3,173,050). However, this organic light-emitting diode suffers from limitations in its applications because of its limited performance. Since Eastman Kodak Co. reported multilayer organic light-emitting diodes in 1987 (C. W. Tang et al., *Appl. Phys. Lett.*, 51, 913 (1987); and *J. Applied Phys.*, 65, 3610 (1989)), remarkable progress has been made in the development of organic light-emitting diodes capable of overcoming the problems of the prior art devices. Organic light-emitting diodes have superior characteristics, such as low driving voltage (e.g., 10 V or less), broad viewing angle, rapid response time and high contrast, over plasma display panels (PDPs) and inorganic electroluminescent display devices. Based on these advantages, organic light-emitting diodes can be used as pixels of graphic displays, television image displays and surface light sources. In addition, organic light-emitting diodes can be fabricated on flexible transparent substrates, can be reduced in thickness and weight, and have good color representation. Therefore, organic light-emitting diodes are recognized as promising devices for use in next-generation flat panel displays (FPDs).

Such organic light-emitting diodes comprise a first electrode as a hole injection electrode (anode), a second electrode as an electron injection electrode (cathode), and an organic light-emitting layer disposed between the anode and the cathode wherein electrons injected from the cathode and holes injected from the anode combine with each other in the organic light-emitting layer to form electron-hole pairs (excitons), and then the excitons fall from the excited state to the ground state and decay to emit light. At this time, the excitons may fall from the excited state to the ground state via the singlet excited state to emit light (i.e. fluorescence), or the excitons may fall from the excited state to the ground state via the triplet excited state to emit light (i.e. phosphorescence). In the case of fluorescence, the probability of the singlet excited state is 25% and thus the luminescence efficiency of the devices is limited. In contrast, phosphorescence can utilize both probabilities of the triplet excited state (75%) and the singlet excited state (25%), and thus the theoretical internal quantum efficiency may reach 100%. Several luminescent materials using the triplet excited state have heretofore been known. For example, some phosphorescent materials using iridium or platinum compounds have been reported in Princeton University and University of California, Los Angeles (UCLA) [Sergey Lamansky et al. *Inorg. Chem.*, 40, 1704-1711, 2001 and *J. Am. Chem. Soc.*, 123, 4304-4312, 2001]. In recent years, there has been increasing need for devices with high efficiency and long lifetime required to realize large-area displays. Under these circumstances, much research has been conducted to develop phosphorescent materials and devices using them.

Examples of phosphorescent host materials that are currently in use include 4,4'-N,N'-dicarbazolylbiphenyl (CBP), ((1,1'-biphenyl)-4-olato)bis(2-methyl-8-quinolinolato N1,O8)aluminum (BAlq), and 2,9-dimethyl-4,7-diphenyl-1,10-phenanthroline (BCP). Since BAlq exhibits optimal energy level characteristics and has the ability to transport charges, BAlq is most generally used as a phosphorescent host material, together with CBP, in a device using N,N'-diphenyl-N,N'-bis(1-naphthyl)-1,1'-biphenyl)-4,4'-diamine (NPB) as a hole transport material and $Alq_3$ as an electron transport material.

U.S. Patent Publication No. 2003/0129452 enumerates aluminum complexes as phosphorescent host materials, and describes that the lifetime of an organic electroluminescence element can be prolonged when the difference in the ionization potential energy between one of the host materials and a hole transport layer is in a range from 0.4 to 0.8 eV. However, the organic electroluminescence element still has the problems that the efficiency is poor and sufficiently long lifetime cannot be ensured.

SUMMARY OF THE INVENTION

Therefore, it is a first object of the present invention to provide an organometallic complex for an organic light-emitting layer that can be used to fabricate an organic light-emitting diode with high efficiency and long lifetime.

It is a second object of the present invention to provide an organic light-emitting diode with high efficiency and long lifetime comprising the organometallic complex of Formula 1.

In accordance with an aspect of the present invention for achieving the first object, there is provided an organometallic complex for an organic light-emitting layer, represented by Formula 1:

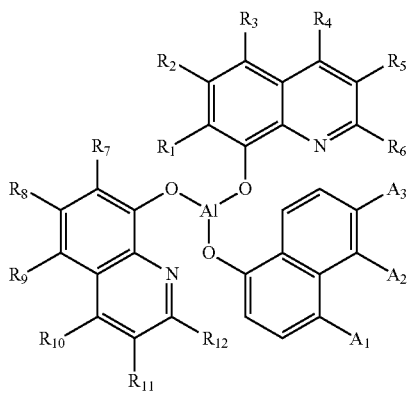

(1)

wherein each of $R_1$ to $R_{12}$ is independently selected from the group consisting of hydrogen, deuterium, halogen, substituted or unsubstituted $C_1$-$C_{12}$ alkyl, substituted or unsubstituted $C_6$-$C_{40}$ arylamino, substituted or unsubstituted $C_3$-$C_{40}$ aryloxy, substituted or unsubstituted $C_6$-$C_{40}$ aryl, substituted or unsubstituted $C_3$-$C_{40}$ heteroaryl, germanium, phosphorus and boron; and each of $A_1$ to $A_3$ is substituted or unsubstituted $C_6$-$C_{40}$ aryl excepting naphthalene, phenanthrene and anthracene, or hydrogen, and may be linked with each other to form a condensed ring. Specifically, $A_1$ may be substituted or unsubstituted phenyl.

In Formula 1, each of $R_1$ to $R_{12}$ and $A_1$ to $A_3$ may be independently substituted with a substituent selected from the group consisting of deuterium, cyano, halogen, hydroxy, nitro, $C_1$-$C_{40}$ alkyl, $C_1$-$C_{40}$ alkoxy, $C_1$-$C_{40}$ alkylamino, $C_6$-$C_{40}$ arylamino, $C_3$-$C_{40}$ heteroarylamino, $C_1$-$C_{40}$ alkylsilyl, $C_6$-$C_{40}$ arylsilyl, $C_6$-$C_{40}$ aryl, $C_3$-$C_{40}$ aryloxy, $C_3$-$C_{40}$ heteroaryl, germanium, phosphorus and boron, and the substituent may be linked with each other to form an aliphatic, aromatic, heteroaliphatic or heteroaromatic condensed ring.

In accordance with another aspect of the present invention for achieving the second object, there is provided an organic light-emitting diode comprising an anode, an organic light-emitting layer and a cathode wherein the organic light-emitting layer includes the organometallic complex represented by Formula 1.

BRIEF DESCRIPTION OF THE DRAWINGS

The above and other objects, features and other advantages of the present invention will be more clearly understood from the following detailed description taken in conjunction with the accompanying drawing, in which.

DETAILED DESCRIPTION OF THE PREFERRED EMBODIMENTS

Figure 1:
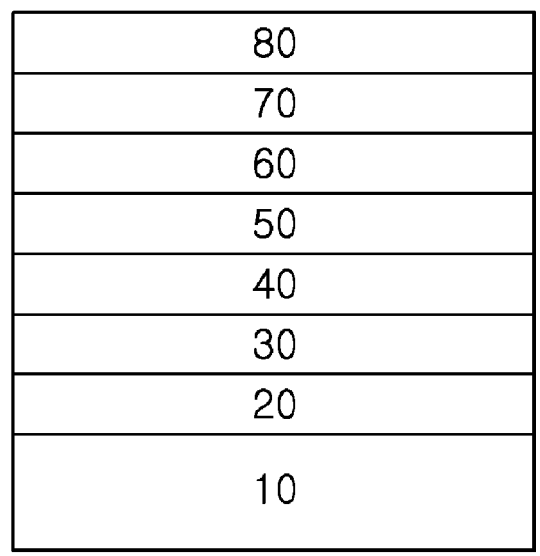
FIG. 1 is a schematic cross-sectional view of an organic light-emitting diode according to an embodiment of the present invention.
Figure 2:
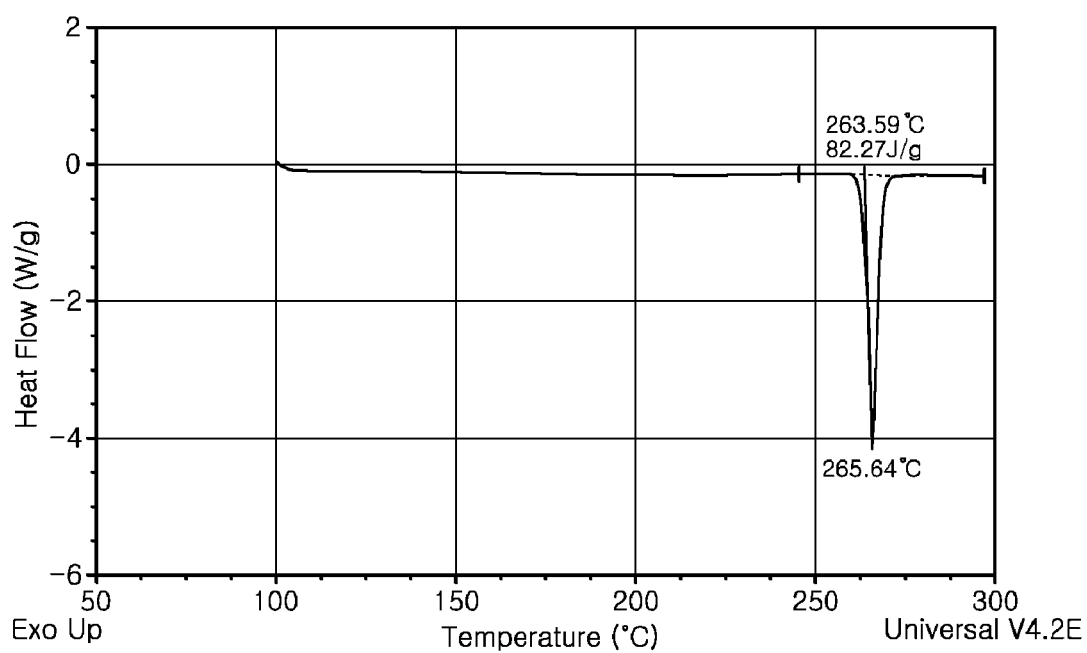
FIGS. 2-7 show differential scanning calorimetry (DSC) analysis results for the compounds produced in Synthesis Examples 1-6.
Figure 3:
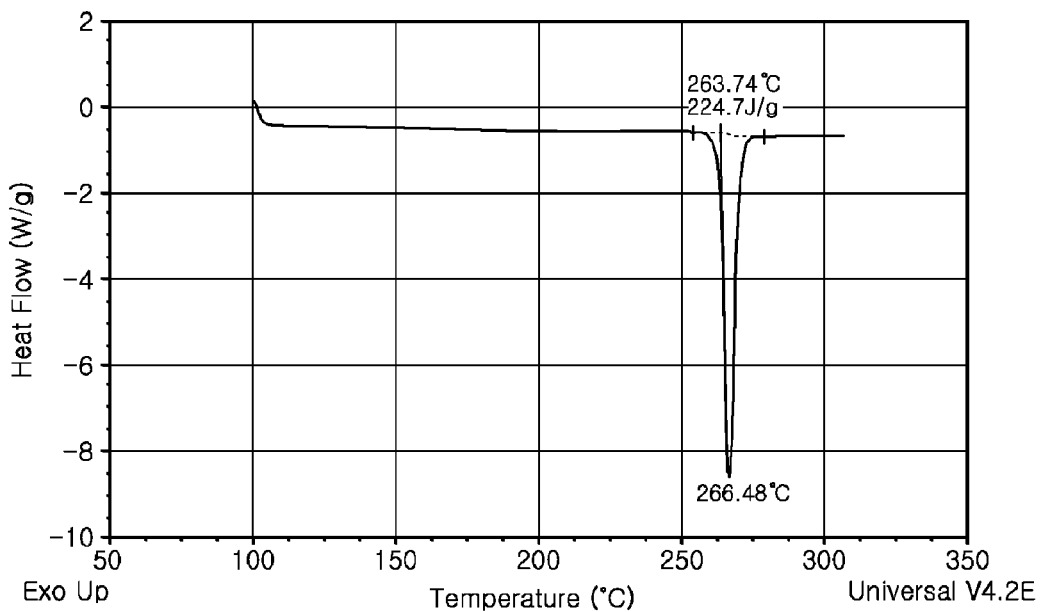
Figure 4:
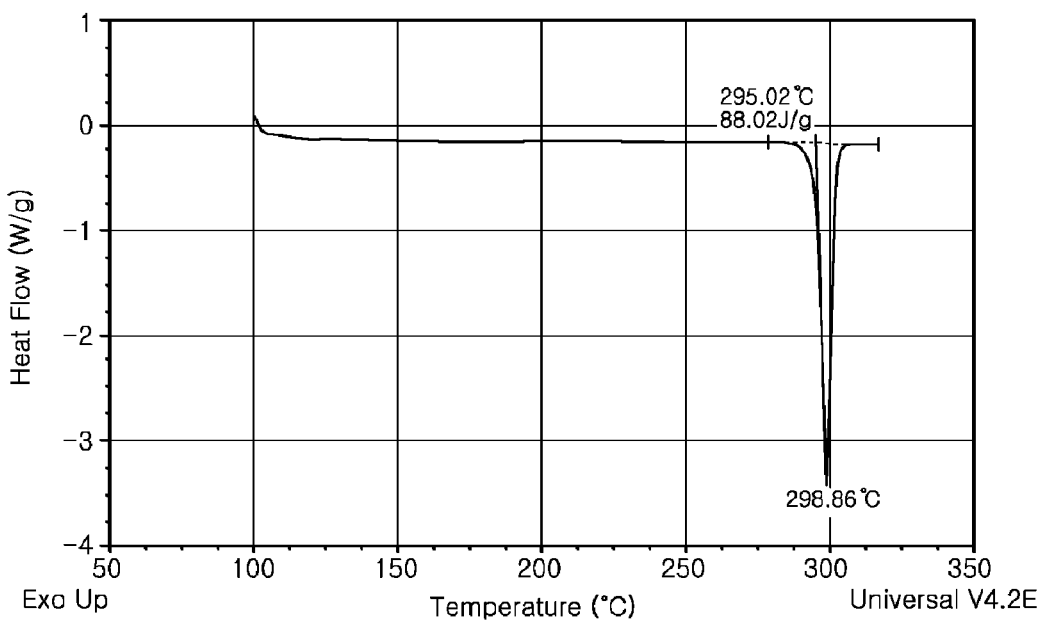
Figure 5:
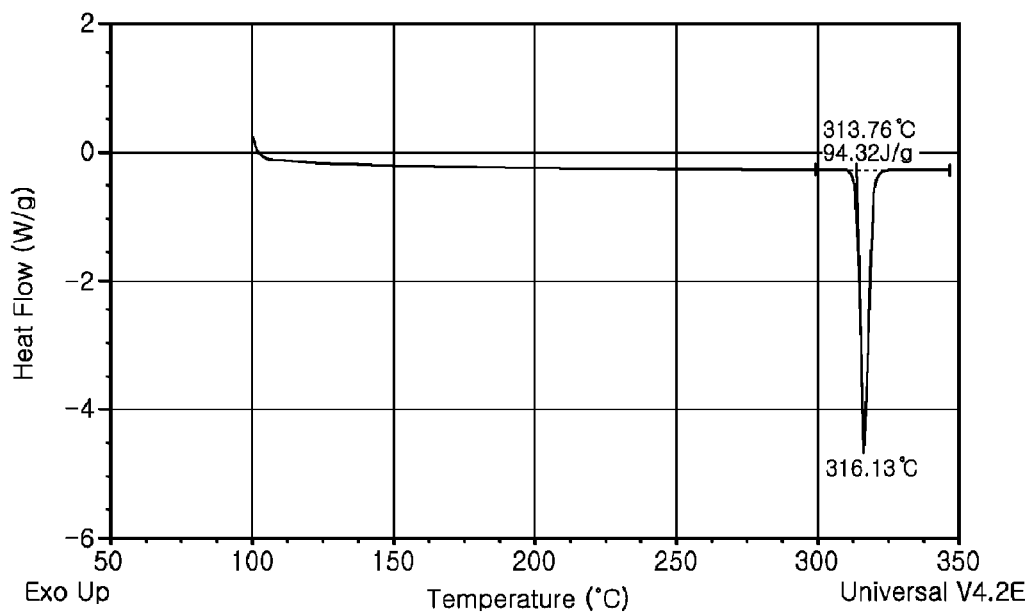
Figure 6:
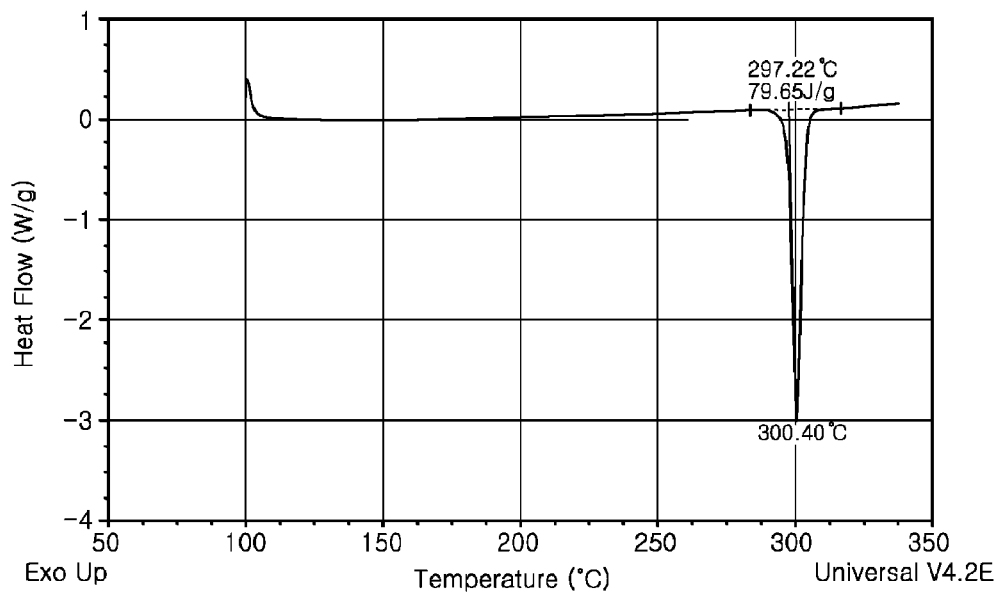
Figure 7:
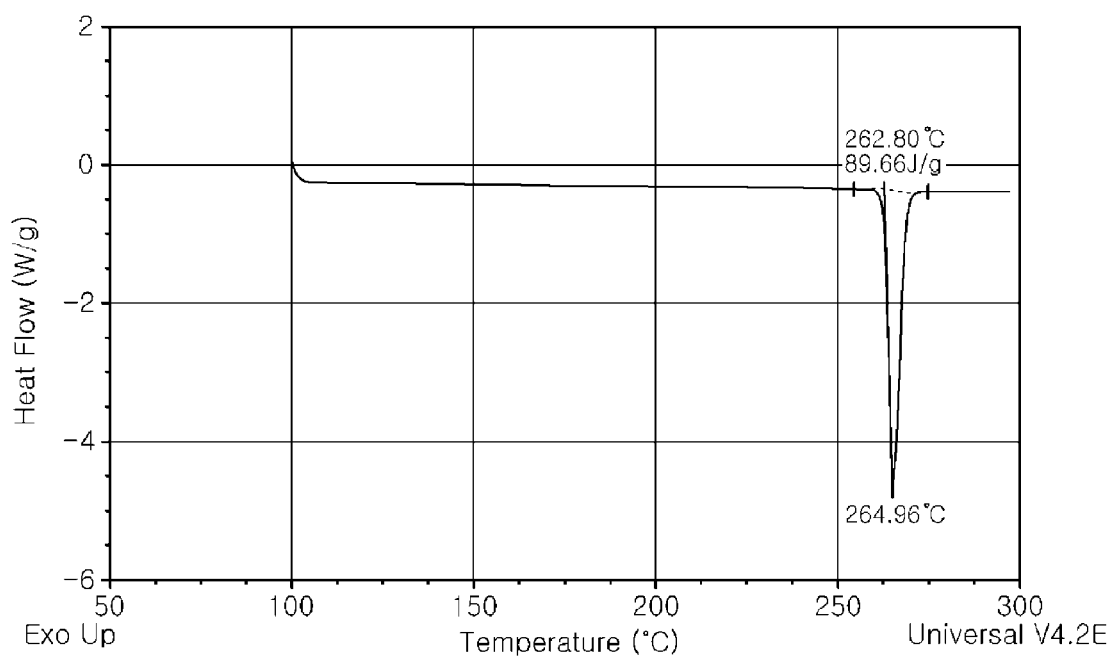
Figure 8:
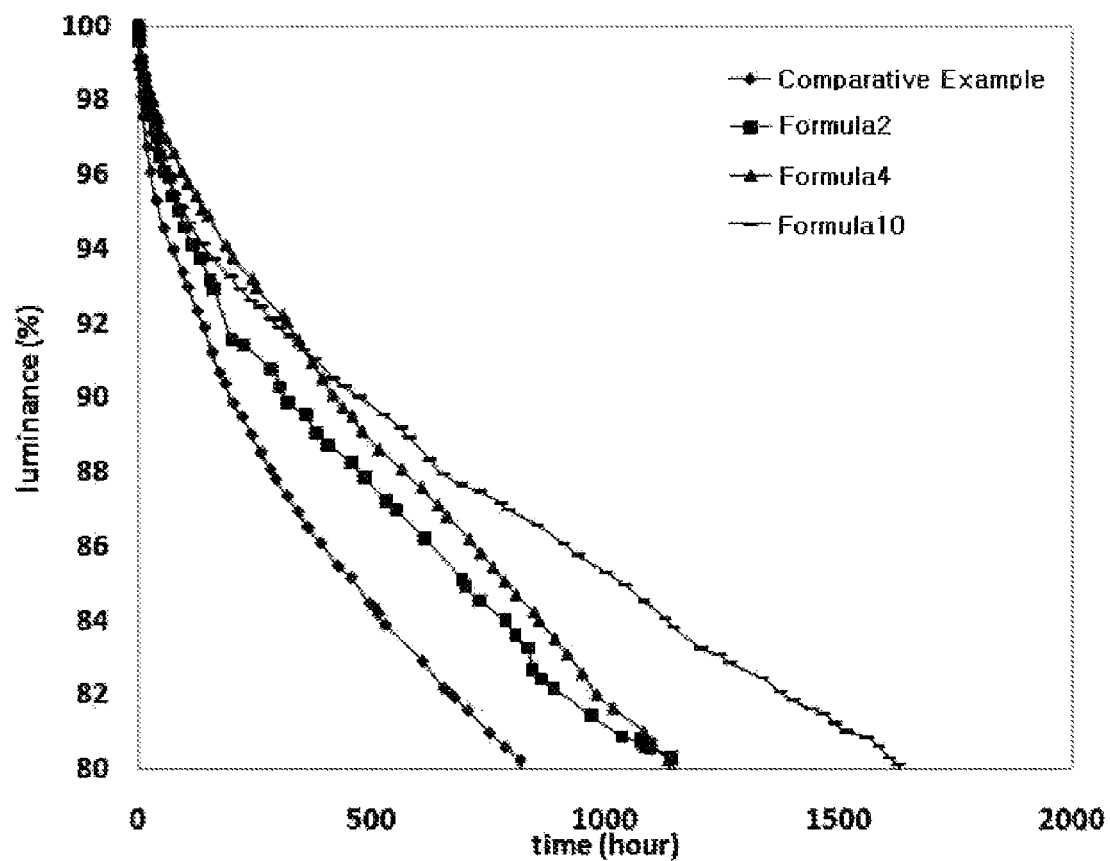
FIG. 8 shows change in luminance with time of the organic light-emitting diodes prepared in Examples and Comparative Example.
Figure 9:
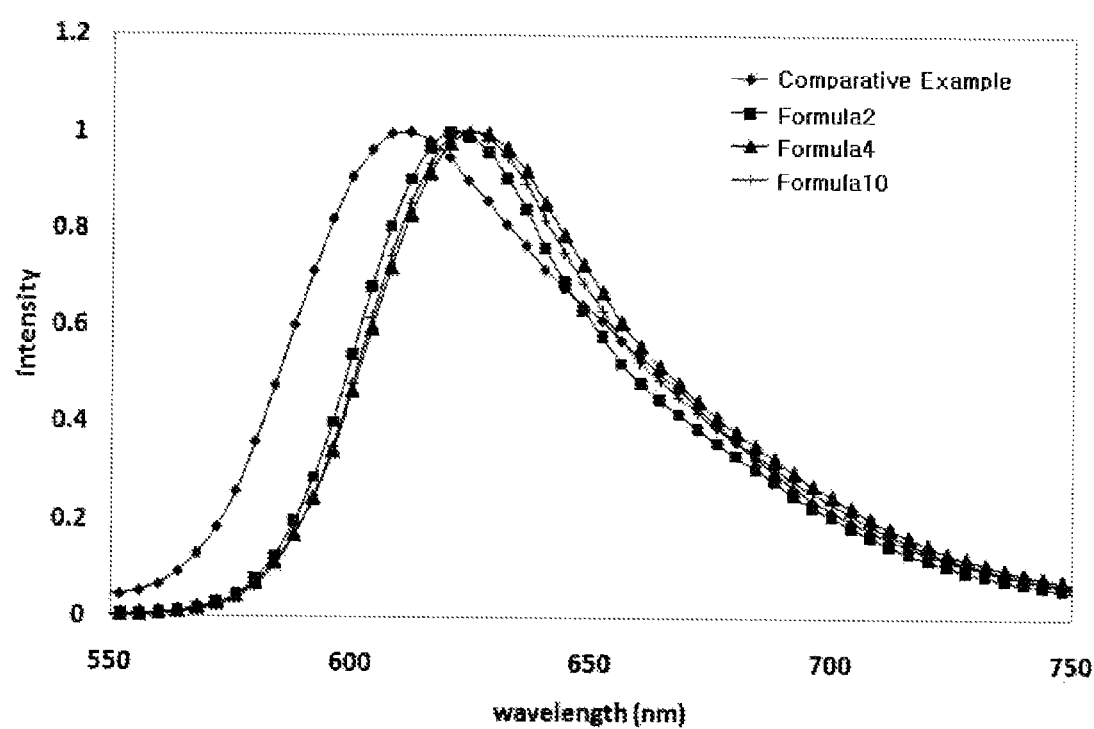
FIG. 9 shows wavelength and intensity of the organic light-emitting diodes prepared in Examples

The present invention will now be described in more detail.
The organometallic complex according to the present invention is represented by Formula 1:

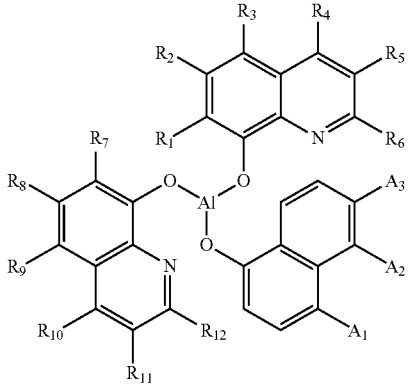

(1)

wherein each of $R_1$ to $R_{12}$ is independently selected from the group consisting of hydrogen, deuterium, halogen, substituted or unsubstituted $C_1$-$C_{12}$ alkyl, substituted or unsubstituted $C_6$-$C_{40}$ arylamino, substituted or unsubstituted $C_3$-$C_{40}$ aryloxy, substituted or unsubstituted $C_6$-$C_{40}$ aryl, substituted or unsubstituted $C_3$-$C_{40}$ heteroaryl, germanium, phosphorus and boron; and each of $A_1$ to $A_3$ is substituted or unsubstituted $C_6$-$C_{40}$ aryl excepting naphthalene, phenanthrene and anthracene, or hydrogen, and may be linked with each other to form a condensed ring. Specifically, $A_1$ may be substituted or unsubstituted phenyl.

In Formula 1, each of $R_1$ to $R_{12}$ and $A_1$ to $A_3$ may be independently substituted with a substituent selected from the group consisting of deuterium, cyano, halogen, hydroxy, nitro, $C_1$-$C_{40}$ alkyl, $C_1$-$C_{40}$ alkoxy, $C_1$-$C_{40}$ alkylamino, $C_6$-$C_{40}$ arylamino, $C_3$-$C_{40}$ heteroarylamino, $C_1$-$C_{40}$ alkylsilyl, $C_6$-$C_{40}$ arylsilyl, $C_6$-$C_{40}$ aryl, $C_3$-$C_{40}$ aryloxy, $C_3$-$C_{40}$ heteroaryl, germanium, phosphorus and boron, and the substituent may be linked with each other to form an aliphatic, aromatic, heteroaliphatic or heteroaromatic condensed ring.

Also, in Formula 1, $A_1$ may be substituted or unsubstituted phenyl. Specifically, it may be exemplified by the following compounds represented by Formulae 2 to 43:

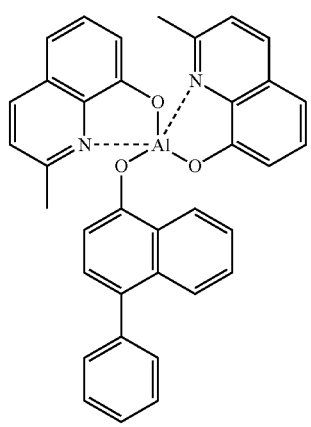

(2)

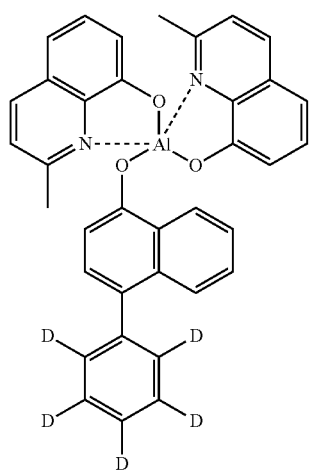
(3)
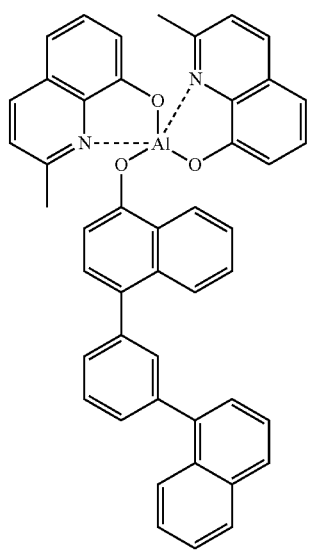
(6)
(4)
(7)
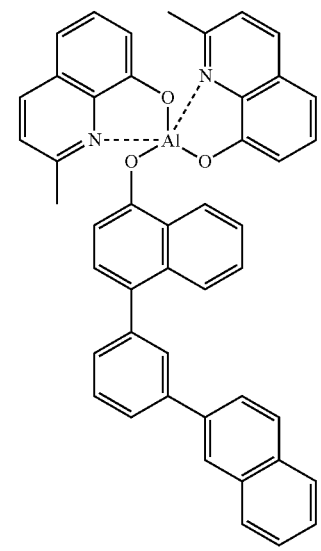
(5)
(8)
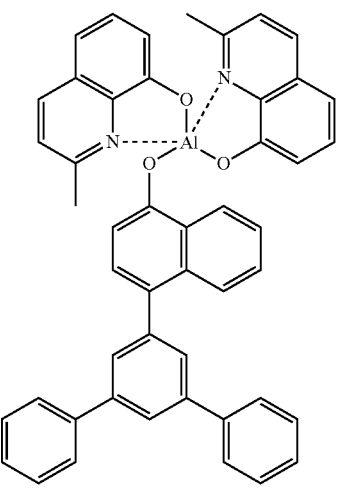

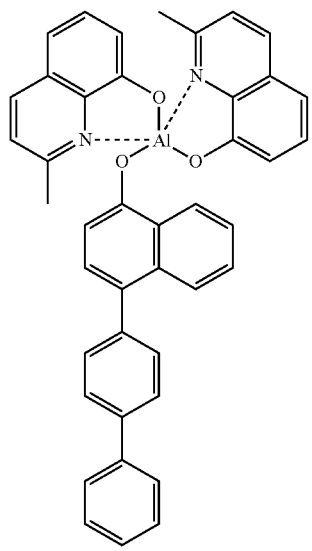
(9)
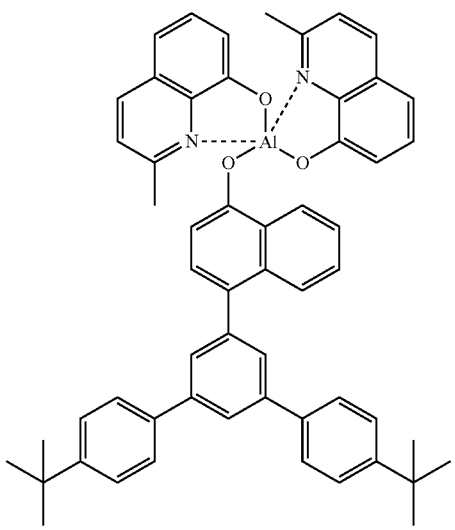
(12)
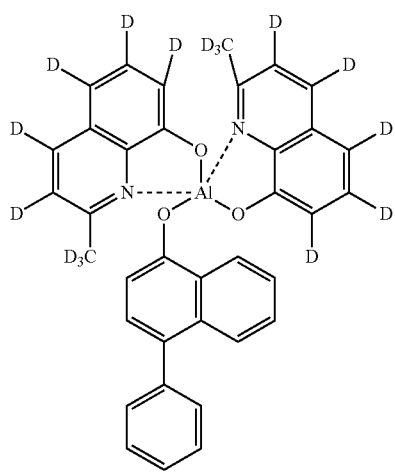
(10)
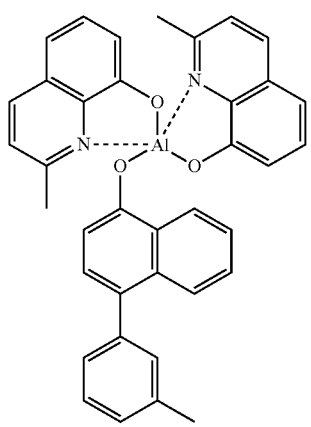
(13)
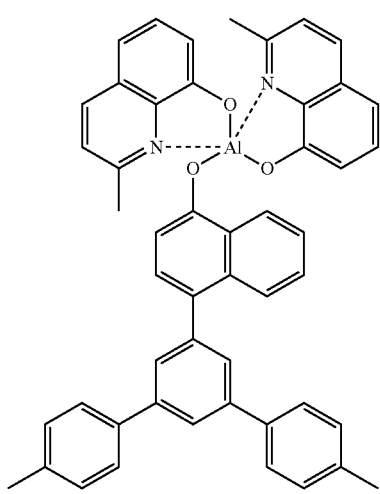
(11)
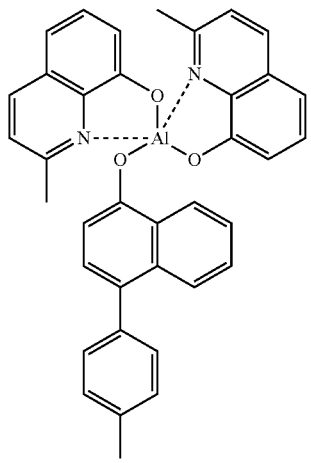
(14)

(15)
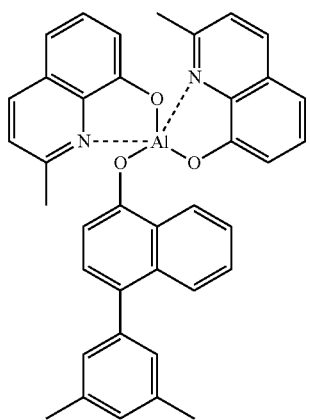
(16)
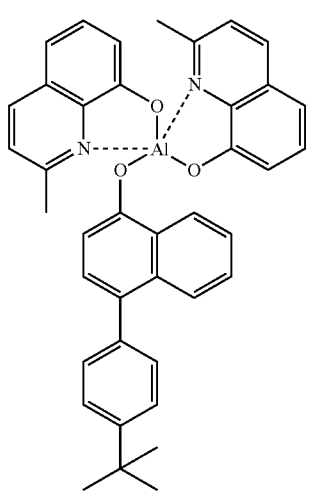
(17)
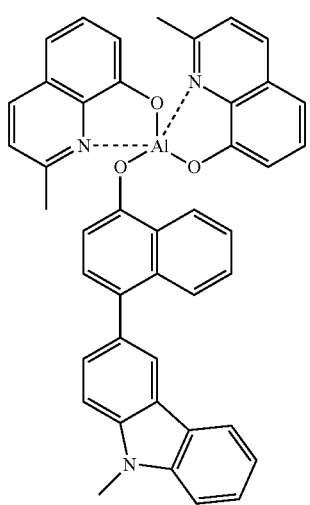
(18)
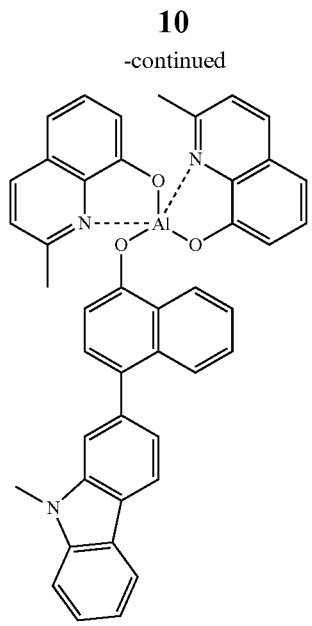
(19)
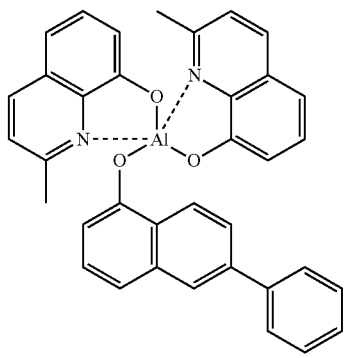
(20)
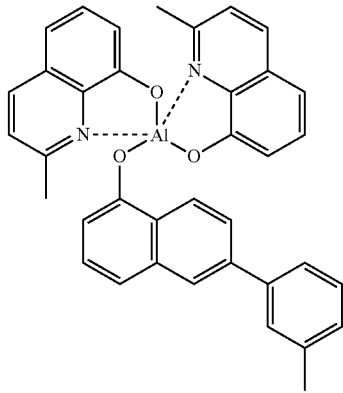

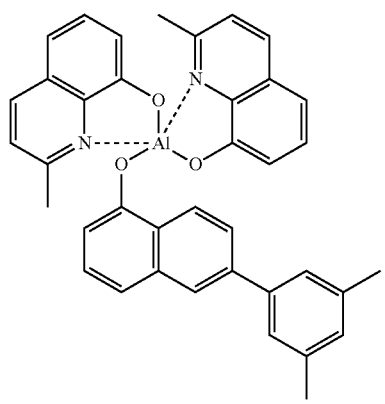
(21)
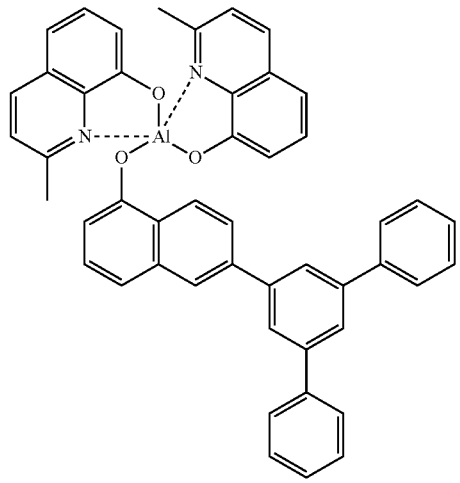
(24)
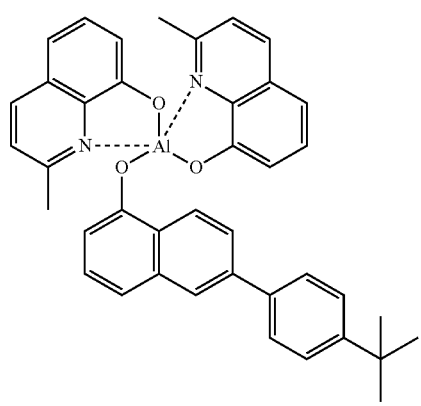
(22)
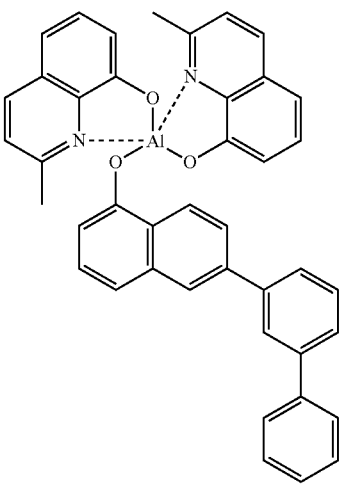
(25)
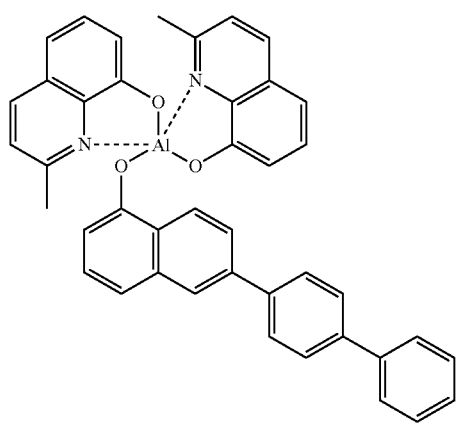
(23)
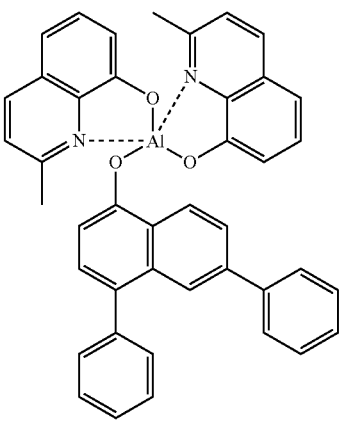
(26)

(27)
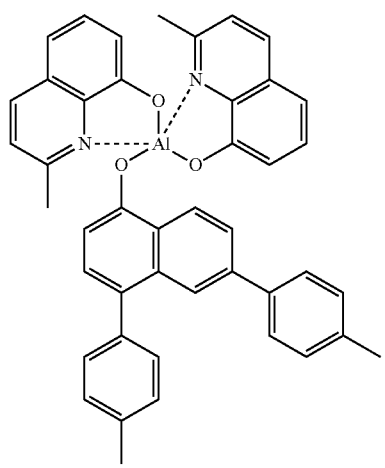
(28)
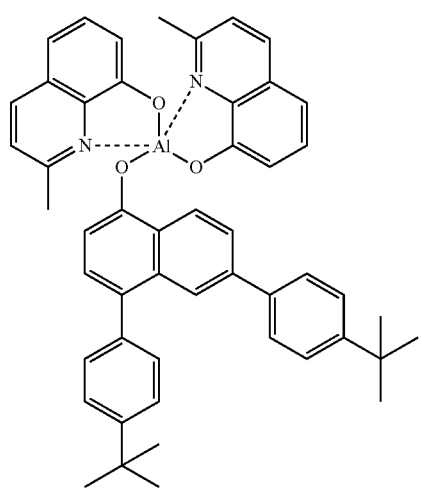
(29)
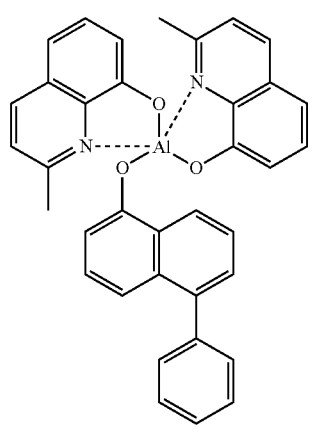
(30)
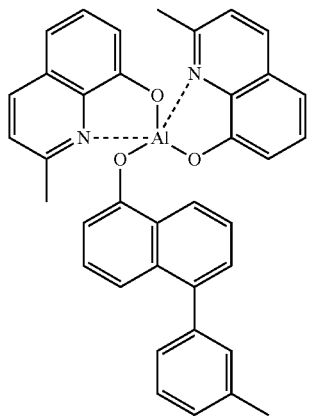
(31)
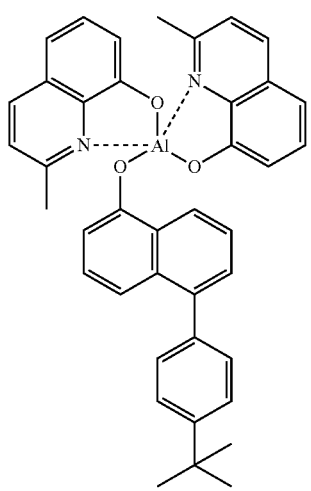
(32)
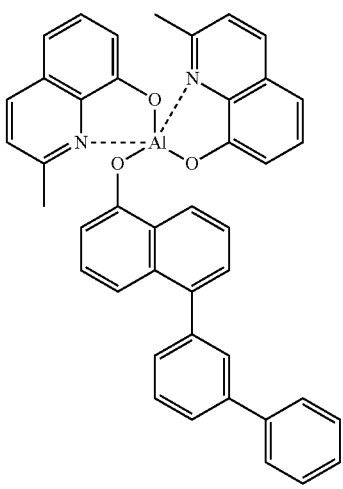

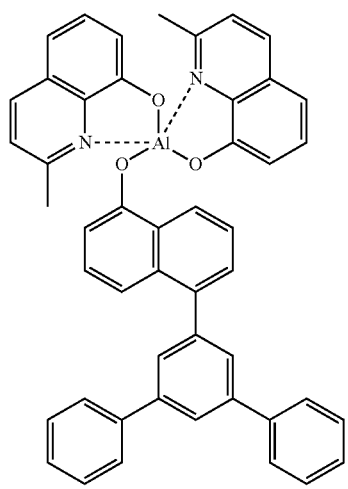
(33)
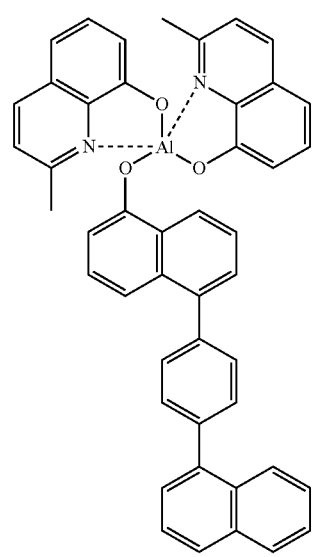
(34)
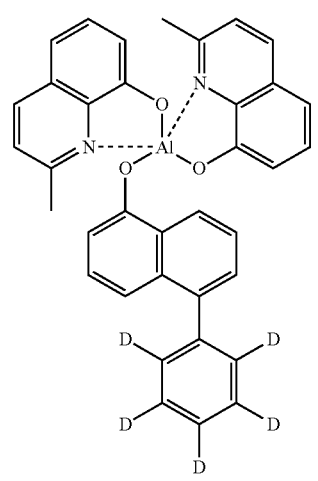
(35)
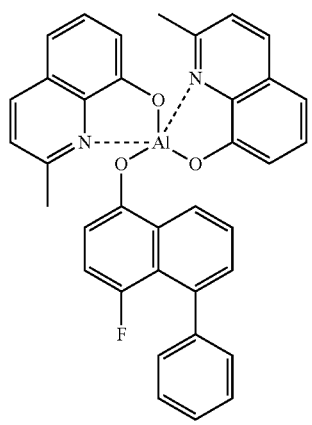
(36)
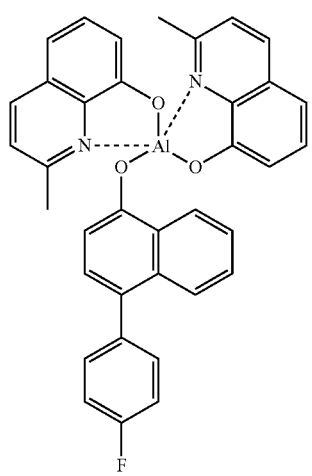
(37)
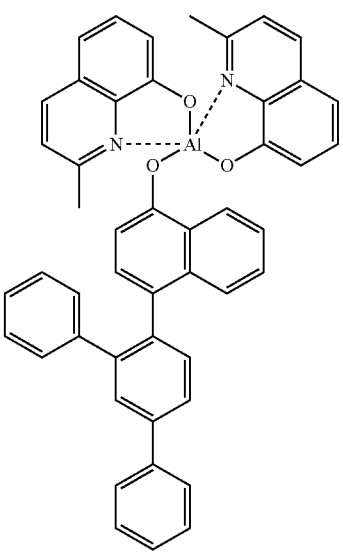
(38)

(39)
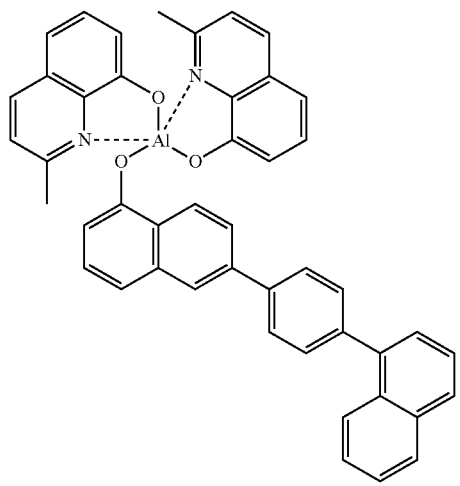

(40)
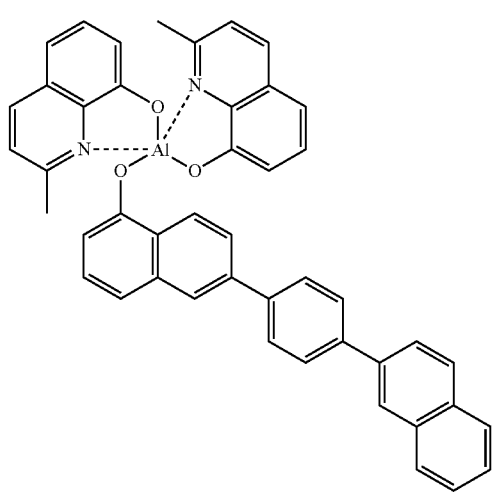

(41)
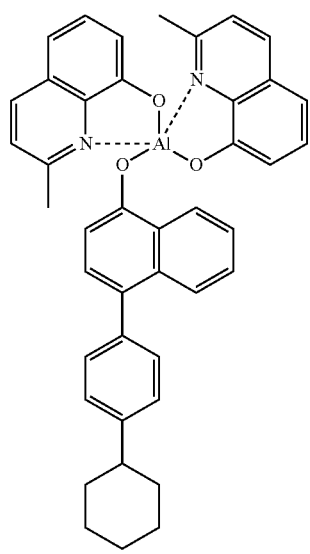

(42)
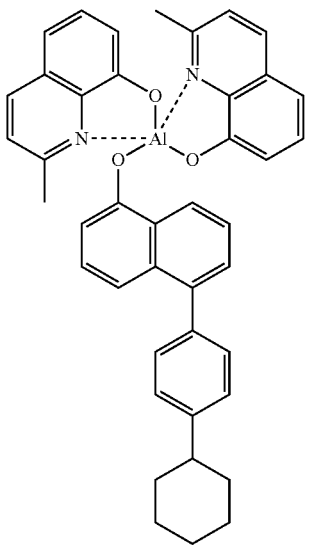

(43)
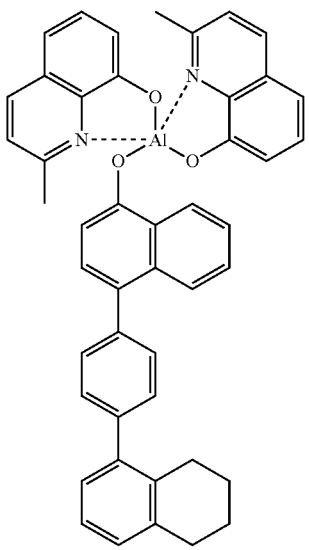

And, the organic light-emitting diode according to the present invention comprises: an anode; a cathode; and a layer disposed between the anode and the cathode and including the organometallic complex of Formula 1.

In an embodiment of the present invention, the organic light-emitting diode may further comprise one or more layer(s) selected from the group consisting of a light-emitting layer, a hole injecting layer, a hole transport layer, an electron blocking layer, a hole blocking layer, an electron transport layer and an electron injecting layer, between the anode and the cathode, and the organometallic complex may be included in the light-emitting layer between the anode and the cathode.

In another embodiment of the present invention, the organic light-emitting diode may further comprise an iridium complex as a dopant of the light-emitting layer, and the iridium complex may be represented by Formula RD-1 or RD-2. The dopant may be used in an amount of 0.1 to 30% by weight of the organometallic complex.

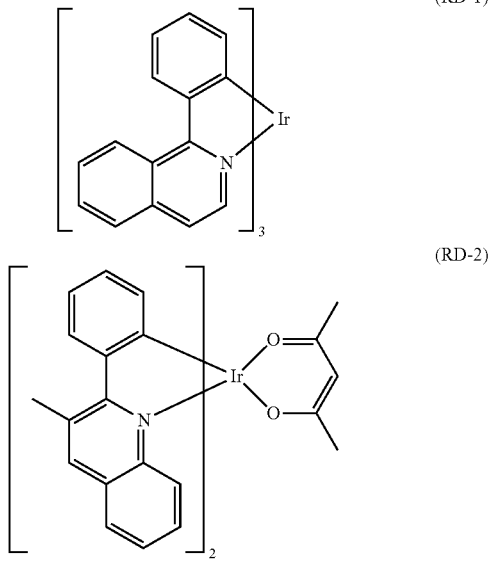

(RD-1)

(RD-2)

The organometallic complex for an organic light-emitting layer according to the present invention is characterized in that it is prepared by modifying a known BAlq derivative to improve the bulk packing characteristics, thus achieving a considerable improvement in the efficiency and lifetime of an organic light-emitting diode using the organometallic complex.

An organic light-emitting layer formed using the organometallic complex employs a host-dopant system based on an energy transfer principle wherein a host is doped with a dopant. In order to effectively use the dopant for light emission and the host for charge transport in the host-dopant system, the following characteristics must be in harmony as a whole: high photoluminescence (PL) efficiency, chemical stability against deposition without degradation, optimal energy levels for balanced charge injection and transport, stability on a molecular level, possible formation of a structurally stable film, etc. These characteristics are determined by the optical and electrical properties of the molecules as well as the bulk packing of the molecules formed by vapor deposition. In conclusion, the optical and electrical properties of the host and the dopant of the organic light-emitting layer and the bulk packing of the molecules formed by vapor deposition may be important factors in determining the lifetime and efficiency of a device comprising the organic light-emitting layer.

The electron density of the highest-occupied molecular orbital (HOMO) of BAlq is concentrated in the phenolic rings of the isoquinoline ligands, whereas that of the lowest-unoccupied molecular orbital (LUMO) of BAlq is concentrated in the pyridyl rings of the isoquinoline ligands. The introduction of a substituent to the isoquinoline ligand leads to a change in the electronic structure or affects the overlap between the phenolic rings and the pyridyl rings, resulting in an increased danger of adverse effects, such as decreased charge carrier mobility. In addition, the possibility that the aluminum may react with oxygen and other materials cannot be excluded. To avoid such problems, the use of an appropriate ligand capable of protecting the aluminum from external attack through steric hindrance is considered. Examples of such ligands include ligands of various structures, such as anthracene, pyrene and perylene. Although it is estimated that the use of a larger ligand facilitates the protection of the aluminum, the use of too large a ligand may make the formation of a bond with the aluminum impossible due to steric hindrance or may increase the possibility of affecting the bonding of the isoquinoline ligands. In view of the foregoing problems, a naphthalene group, which is found to have an appropriate size, is introduced to the organometallic complex of the present invention instead of biphenyl without deforming the substituents of the isoquinoline ligands. As a result, an increase in the lifetime of the organometallic complex can be expected due to the protective effects on the aluminum. Substitution with a simple naphthalene ring may cause the danger that intermolecular π-π stacking will not be facilitated due to steric effects. In the present invention, an aromatic ring is additionally introduced to a naphthalene ring so as to facilitate π-π stacking, and as a result, the bulk packing characteristics of the molecules are improved, thereby achieving an increase in the efficiency of an organic light-emitting device comprising the organometallic complex of the present invention.

The organic light-emitting diode of the present invention comprises an organic light-emitting layer including the organometallic complex of Formula 1, an anode and a cathode. The organic light-emitting diode of the present invention is characterized by high efficiency and long lifetime, which are attributed to the structural characteristics of the organometallic complex.

As mentioned earlier, the organic light-emitting layer used in the present invention employs a host-dopant system. A host material and a dopant material only can generally be used to emit light. In this case, however, the efficiency and luminance of a light-emitting layer formed using the materials are very low. In addition, the individual molecules are in close proximity to each other to cause the formation of excimers, and as a result, the inherent characteristics of the individual molecules are not sufficiently observed. Accordingly, it is preferred to dope the host material with the dopant material to form a light-emitting layer.

The dopant is not particularly limited so long as it is routinely used in the art. As the dopant, there may be exemplified an iridium complex.

Particularly, the dopant may be represented by the following formulas RD-1 or RD-2:

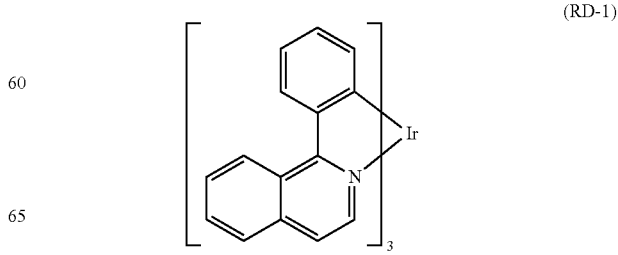

(RD-1)

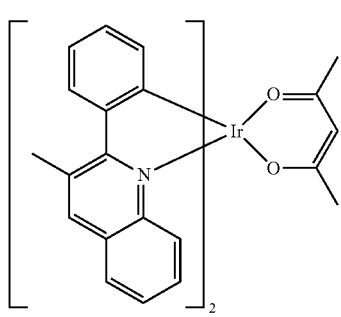

(RD-2)

It is preferred that the dopant be used in an amount of 0.1 to 30% by weight of the organometallic complex. When the dopant is used in an amount smaller than 0.1% by weight, the addition effects of the dopant are no or few. Meanwhile, when the dopant is used in an amount larger than 30% by weight, there arises the risk that the efficiency of the device may be decreased due to triplet-triplet annihilation.

The organic light-emitting diode of the present invention may further comprise a hole transport layer (HTL) disposed between the anode and the organic light-emitting layer, and an electron transport layer (ETL) disposed between the cathode and the organic light-emitting layer. The hole transport layer is formed to facilitate the injection of holes from the anode. As an exemplary material for the hole transport layer, an electron-donating compound having a low ionization potential is used. Examples of widely used electron-donating compounds include diamine, triamine and tetraamine derivatives whose basic skeleton is triphenylamine. Any material that is commonly used in the art may be used to form the hole transport layer in the present invention, and examples thereof include, but are not limited to, N,N'-bis(3-methylphenyl)-N, N'-diphenyl-[1,1'-biphenyl]-4,4'-diamine (TPD) and N,N'-di (naphthalen-1-yl)-N,N'-diphenylbenzidine (α-NPD).

The organic light-emitting diode of the present invention may further comprise a hole injecting layer (HIL) disposed under the hole transport layer. Any material that is commonly used in the art may be used without any particular limitation to form the hole injecting layer in the present invention. Suitable materials for the hole injecting layer include CuPc and starburst-type amines, e.g., TCTA, m-MTDATA and IDE406 (available from Idemitsu), some of which are enumerated below:

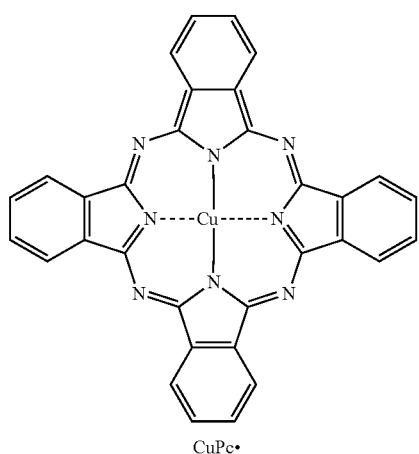

CuPc·

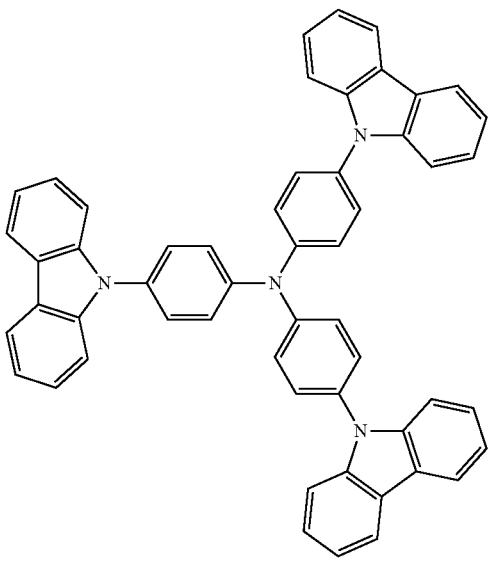

TCTA·

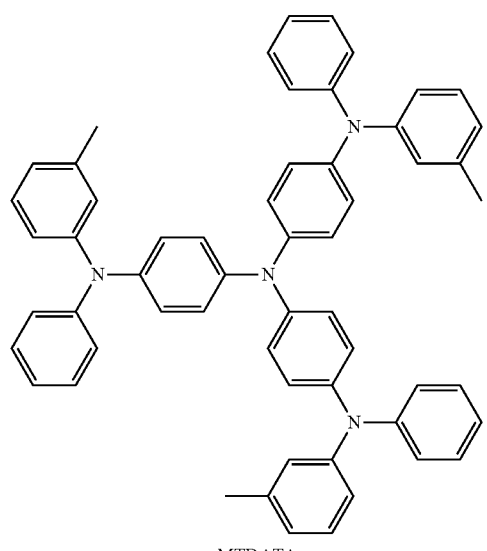

m-MTDATA

The electron transport layer of the organic light-emitting diode according to the present invention serves to sufficiently transport electrons from the cathode to the organic light-emitting layer, and to inhibit the migration of unbound holes in the organic light-emitting layer, thereby increasing the opportunity for the unbound holes to recombine with the electrons in the emitting layer. It is to be understood that any material can be used without any particular limitation to form the electron transport layer so long as it is commonly used in the art. For example, an oxadiazole derivative, such as PBD, BMD, BND or $Alq_3$, may be used to form the electron transport layer. The organic light-emitting diode of the present invention may further comprise an electron injecting layer (EIL) disposed on the electron transport layer to facilitate the injection of electrons from the cathode. The formation of the electron injecting layer contributes to an improvement in the power efficiency of the device. Any material that is commonly used in the art may be used to form the electron injecting layer in the present invention, and examples thereof include, but are not limited to, LiF, NaCl, CsF, Li$_2$O and BaO.

FIG. 1 is a cross-sectional view showing the structure of an organic electroluminescent device according to an embodiment of the present invention. The organic light-emitting diode of the present invention comprises an anode 20, a hole transport layer 40, an organic light-emitting layer 50, an electron transport layer 60, and a cathode 80. If necessary, the organic light-emitting diode may further comprise a hole injecting layer 30 and an electron injecting layer 70. In addition to the hole and electron injecting layers, the organic light-emitting diode may further comprise one or two intermediate layers, optionally together with a hole blocking layer or an electron blocking layer.

With reference to FIG. 1, the organic electroluminescent device of the present invention and a fabrication method thereof will be explained below. First, an anode material is coated on a substrate 10 to form an anode 20. The substrate 10 may be any one used in common organic EL devices. An organic substrate or a transparent plastic substrate is preferred in terms of transparency, surface smoothness, ease of handling and waterproof qualities. As the anode material, a transparent and electrically conductive material is used, for example, indium tin oxide (ITO), indium zinc oxide (IZO), tin oxide (SnO$_2$) or zinc oxide (ZnO). A hole injecting material is deposited on the anode 20 by vacuum thermal evaporation or spin coating to form a hole injecting layer 30, and then a hole transport material is deposited on the hole injecting layer 30 by vacuum thermal evaporation or spin coating to form a hole transport layer 40. Subsequently, an organic light-emitting layer 50 is formed on the hole transport layer 40. If desired, a hole blocking layer (not shown) may be formed on the organic light-emitting layer 50 by vacuum deposition or spin coating. The hole blocking layer is formed of a material having a very low HOMO level to eliminate the problems, i.e. shortened lifetime and low efficiency of the device, which are encountered when holes enter the cathode through the organic light-emitting layer. The hole blocking material is not particularly restricted, but it must have the ability to transport electrons and a higher ionization potential than the light-emitting compound. Representative hole blocking materials are BAlq, BCP and TPBI. An electron transport layer 60 is formed on the hole blocking layer by vacuum deposition or spin coating, and an electron injecting layer 70 is formed thereon. A cathode metal is deposited on the electron injecting layer 70 by vacuum thermal evaporation to form a cathode 80, completing the fabrication of the organic electroluminescent (EL) device.

As the cathode metal, for example, lithium (Li), magnesium (Mg), aluminum (Al), aluminum-lithium (Al—Li), calcium (Ca), magnesium-indium (Mg—In), magnesium-silver (Mg—Ag), or the like may be used. A light-transmissive cathode made of ITO or IZO may be used to fabricate a top emission device.

Hereinafter, the present invention will be explained in more detail with reference to the following preferred examples. However, these examples are not intended to limit the present invention.

EXAMPLES

Synthesis Example 1

Synthesis of compound of Formula 2

1-a. Synthesis of 1-bromo-4-methoxynaphthalene

1-Bromo-4-methoxynaphthalene was synthesized as follows.

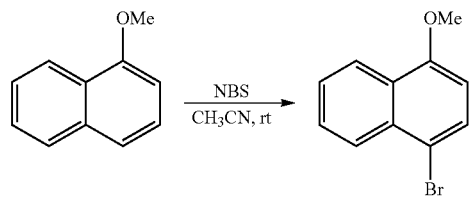

1-Methoxynaphthalene (250 g, 1.58 mol) and acetonitrile (3500 mL) were stirred in a 10 L round-bottom flask. After adding bromosuccinimide (253.1 g, 1.42 mol), the mixture was added stirred for 24 hours. After completion of the reaction, the reaction mixture was concentrated under reduced pressure to remove the solvent, and the concentrate was stirred in hexane (1 L) and then filtered. Concentration of the filtrate under reduced pressure followed by column purification using hexane yielded a liquid product (345.2 g, 1.46 mol, 92.1%).

1-b. Synthesis of 1-methoxy-4-phenylnaphthalene

1-Methoxy-4-phenylnaphthalene was synthesized as follows.

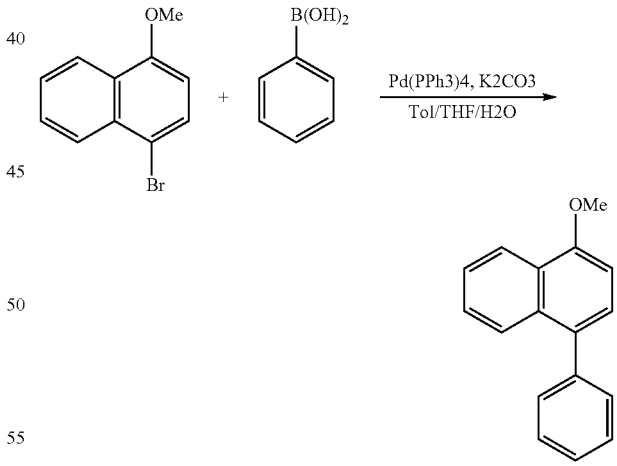

1-Bromo-4-methoxynaphthalene (25 g, 0.105 mol), phenylboronic acid (17.4 g, 0.137 mol), potassium carbonate (21.9 g, 0.16 mol), tetrakis(triphenylphosphine)palladium(0) (2.4 g, 0.01 mol), water (25 mL), tetrahydrofuran (75 mL) and toluene (75 mL) were stirred in a 250 mL round-bottom flask for 12 hours under reflux. After completion of the reaction, the reaction mixture was cooled to room temperature and extracted with ethyl acetate (300 mL) and water (1000 mL). The organic layer was dried with magnesium sulfate and then concentrated under reduced pressure to obtain a solid. The solid was dissolved in hot toluene (200 mL) and then filtered. The filtrate was recrystallized in methanol (500 mL). The produced solid was filtered and washed with hexane (300 mL) to yield a product (20 g, 0.084 mol, 79.2%).

1-c. Synthesis of 1-hydroxy-4-phenylnaphthalene

1-Hydroxy-4-phenylnaphthalene was synthesized as follows.

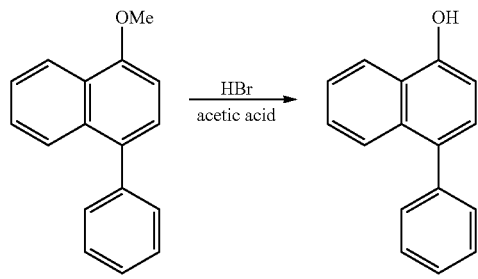

1-Methoxy-4-phenylnaphthalene (20 g, 0.083 mol), acetic acid (200 mL) and bromic acid (180 mL) were stirred in a 1 L round-bottom flask under reflux. After completion of the reaction, the reaction mixture was cooled to room temperature and water (200 mL) was added. The resultant solid was filtered, dissolved in dichloromethane (1 L), and washed twice with water (400 mL). Column purification of the organic layer using dichloromethane followed by recrystallization using dichloromethane and hexane for 3 times yielded a product (6.6 g, 0.029 mol, 35%).

1-d. Synthesis of Compound of Formula 2

Compound of Formula 2 was synthesized as follows.

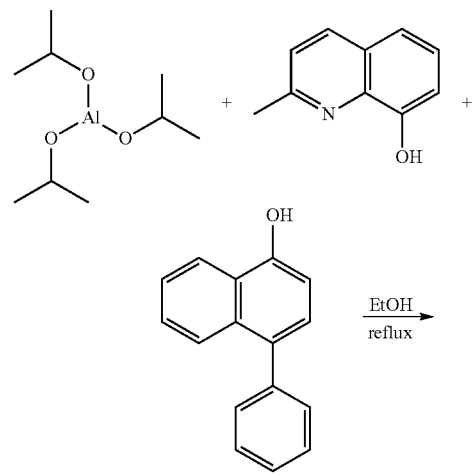

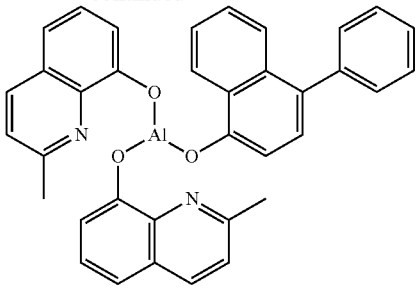

Aluminum propoxide (4.8 g, 0.024 mol), 1-hydroxy-4-phenylnaphthalene (5.3 g, 0.023 mol) and ethanol (192 mL) were stirred in a 500 mL round-bottom flask for 2 hours under reflux. After adding 2-methyl-8-quinolinol (7.5 g, 0.047 mol), the reaction mixture was stirred for 20 hours under reflux. After completion of the reaction, the reaction mixture was cooled to room temperature, filtered, and washed with ethanol. The filtrate (10.5 g) was purified by sublimation for 3 times without chemical purification to obtain a product.

Elemental analysis (EA): Theoretical—C, 76.86%; H, 4.84%; N, 4.98%.

Actual—C, 76.42%; H, 4.63%; N, 4.88%.

Synthesis Example 2

Synthesis of Compound of Formula 3

2-a. Synthesis of 1-methoxy-4-(phenyl-d5)naphthalene

1-Methoxy-4-(phenyl-d5)naphthalene was synthesized as follows.

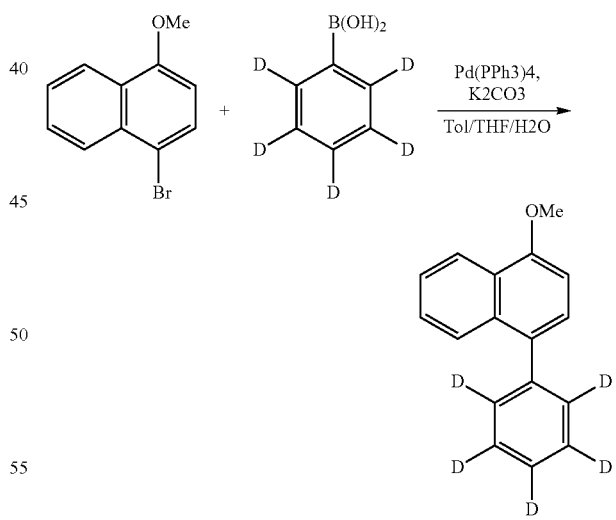

1-Bromo-4-methoxynaphthalene (25 g, 0.105 mol), (phenyl-d5)boronic acid (17.4 g, 0.137 mol), potassium carbonate (21.9 g, 0.16 mol), tetrakis(triphenylphosphine)palladium(0) (2.4 g, 0.01 mol), water (25 mL), tetrahydrofuran (75 mL) and toluene (75 mL) were stirred in a 250 mL round-bottom flask for 12 hours under reflux. After completion of the reaction room temperature, the reaction mixture was cooled to room temperature and extracted with ethyl acetate (300 mL) and water (1000 mL). The organic layer was dried with magnesium sulfate and concentrated under reduced pressure to obtain a solid. The solid was dissolved in hot toluene (200 mL) and filtered. The filtrate was recrystallized in methanol (500 mL). The resultant solid was filtered and washed with hexane (300 mL) to obtain a product (23 g, 0.096 mol, 91.1%).

2-b. Synthesis of 1-hydroxy-4-(phenyl-d5)naphthalene

1-Hydroxy-4-(phenyl-d5)naphthalene was synthesized as follows.

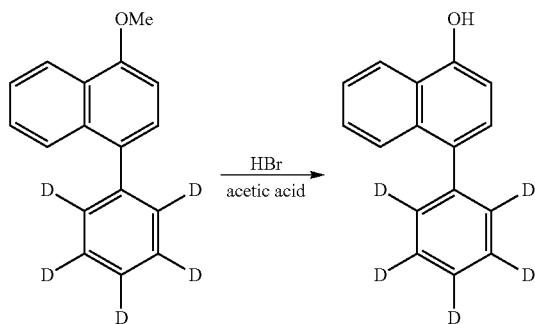 [SMILES: [2H]c1c([2H])c([2H])c(-c2ccc(OC)c3ccccc23)c([2H])c1[2H] ; Br ; [2H]c1c([2H])c([2H])c(-c2ccc(O)c3ccccc23)c([2H])c1[2H]]

1-Methoxy-4-(phenyl-d5)naphthalene (23 g, 0.096 mol), acetic acid (230 mL) and bromic acid (190 mL) were stirred in a 1 L round-bottom flask under reflux. After completion of the reaction, the reaction mixture was cooled to room temperature and water (200 mL) was added. The resultant solid was filtered, dissolved in dichloromethane (1 L), and washed twice with water (400 mL). Column purification of the organic layer using dichloromethane followed by recrystallization using dichloromethane and hexane for 3 times yielded a product (6.6 g, 0.033 mol, 35%).

2-c. Synthesis of Compound of Formula 3

Compound of Formula 3 was synthesized as follows.

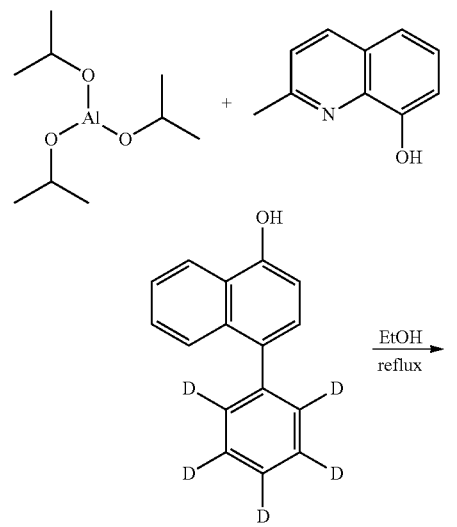

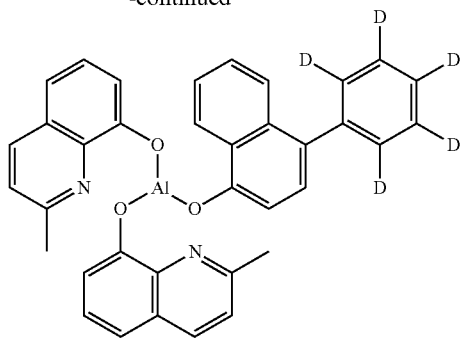

Aluminum propoxide (4.8 g, 0.024 mol), 1-hydroxy-4-(phenyl-d5)naphthalene (5.3 g, 0.023 mol) and ethanol (192 mL) were stirred in a 500 mL round-bottom flask for 2 hours under reflux. After adding 2-methyl-8-quinolinol (7.5 g, 0.047 mol), the reaction mixture was stirred for 20 hours under reflux. After completion of the reaction, the reaction mixture was cooled to room temperature, filtered, and washed with ethanol. The resulting filtrate (10.2 g) was purified by sublimation for 3 times without chemical purification to obtain a product.

EA: Theoretical—C, 76.17%; H, 5.68%; N, 4.94%.
Actual—C, 75.66%; H, 5.73%; N, 4.91%.

Synthesis Example 3

Synthesis of Compound of Formula 4

3-a. Synthesis of 1-methoxy-4-{4-(naphthalen-1-yl)phenyl}naphthalene

1-Methoxy-4-{4-(naphthalen-1-yl)phenyl} was synthesized as follows.

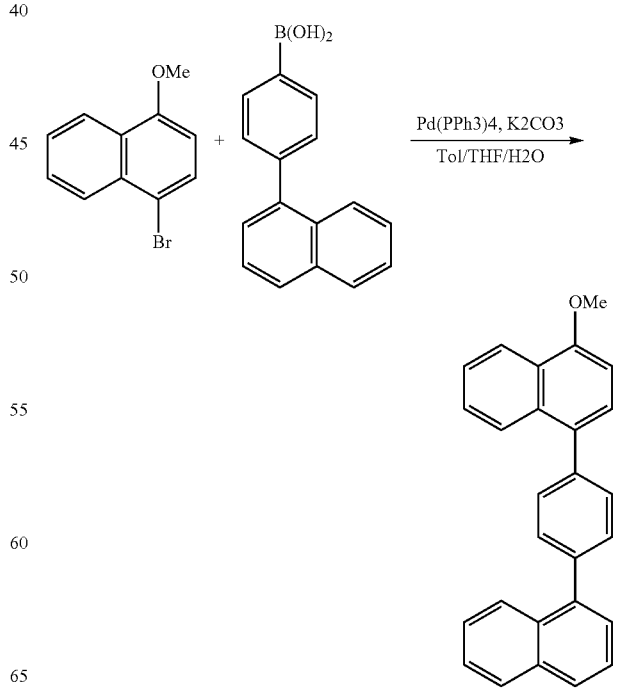

1-Bromo-4-methoxynaphthalene (25 g, 0.105 mol), 4-(naphthalen-1-yl)phenylboronic acid (30.4 g, 0.137 mol), potassium carbonate (21.9 g, 0.16 mol), tetrakis(triphenylphosphine)palladium(0) (2.4 g, 0.01 mol), water (25 mL), tetrahydrofuran (75 mL) and toluene (75 mL) were stirred in a 250 mL round-bottom flask for 12 hours under reflux. After completion of the reaction, the reaction mixture was cooled to room temperature and extracted with ethyl acetate (300 mL) and water (1000 mL). The organic layer was dried with magnesium sulfate and concentrated under reduced pressure to obtain a solid. The solid was dissolved in hot toluene (400 mL) and then filtered. The filtrate was recrystallized in methanol (800 mL). The resultant solid was filtered and washed with hexane (300 mL) to obtain a product (20 g, 0.055 mol, 52.6%).

3-b. Synthesis of 1-hydroxy-4-{4-(naphthalen-1-yl)phenyl}naphthalene

1-Hydroxy-4-{4-(naphthalen-1-yl)phenyl}naphthalene was synthesized as follows.

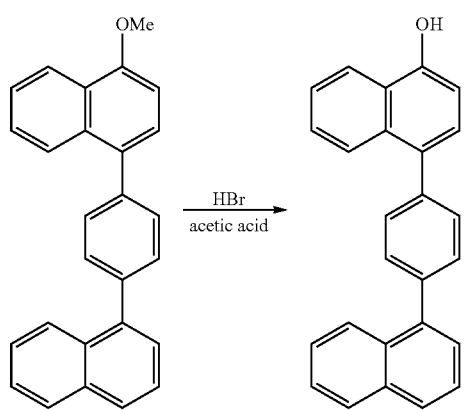 [SMILES: COc1ccc(-c2ccc(-c3cccc4ccccc34)cc2)c2ccccc12 ; Br ; Oc1ccc(-c2ccc(-c3cccc4ccccc34)cc2)c2ccccc12]

1-Methoxy-4-{4-(naphthalen-1-yl)phenyl}naphthalene (20 g, 0.055 mol), acetic acid (200 mL) and bromic acid (180 mL) were stirred in a 1 L round-bottom flask under reflux. After completion of the reaction, the reaction mixture was cooled to room temperature and water (200 mL) was added. The resulting solid was filtered, dissolved in dichloromethane (1.2 L), and washed twice with water (400 mL). Column purification of the organic layer using dichloromethane followed by recrystallization using dichloromethane and hexane for 3 times yielded a product (6.6 g, 0.019 mol, 34.3%).

3-c. Synthesis of Compound of Formula 4

Compound of Formula 4 was synthesized as follows.

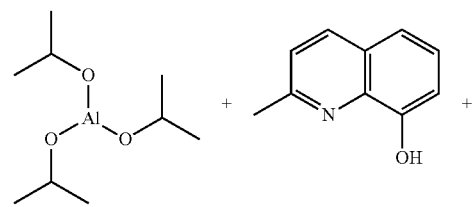

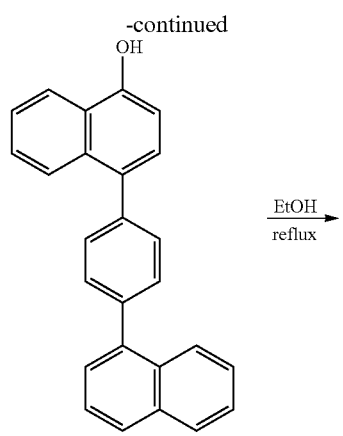

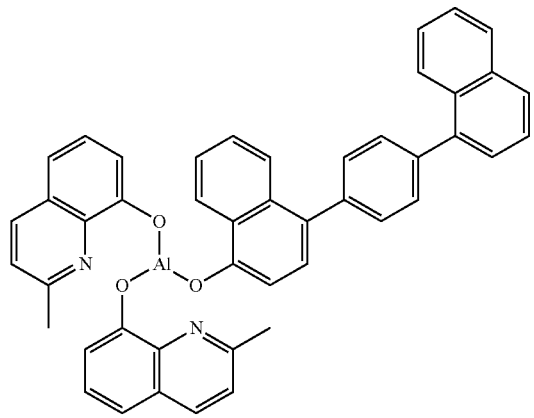

Aluminum propoxide (4.8 g, 0.024 mol), 1-hydroxy-4-{4-(naphthalen-1-yl)phenyl}naphthalene (8.1 g, 0.023 mol) and ethanol (192 mL) were stirred in a 500 mL round-bottom flask for 2 hours under reflux. After adding 2-methyl-8-quinolinol (7.5 g, 0.047 mol), the reaction mixture was stirred for 20 hours under reflux. After completion of the reaction, the reaction mixture was cooled to room temperature, filtered, and washed with ethanol. The resulting filtrate (13.2 g) was purified by sublimation for 3 times without chemical purification to obtain a product.

EA: Theoretical—C, 80.22%; H, 4.83%; N, 4.07%.

Actual—C, 80.64%; H, 4.77%; N, 3.96%.

Synthesis Example 4

Synthesis of Compound of Formula 5

4-a. Synthesis of 1-methoxy-4-{4-(naphthalen-2-yl)phenyl}naphthalene

1-Methoxy-4-{4-(naphthalen-2-yl)phenyl} was synthesized as follows.

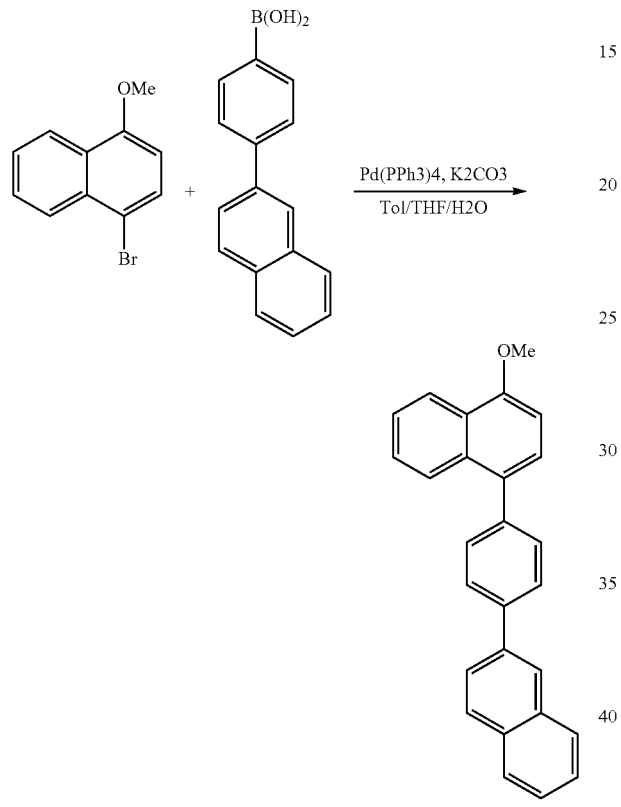

1-Bromo-4-methoxynaphthalene (25 g, 0.105 mol), 4-(naphthalen-2-yl)phenylboronic acid (30.4 g, 0.137 mol), potassium carbonate (21.9 g, 0.16 mol), tetrakis(triphenylphosphine)palladium(0) (2.4 g, 0.01 mol), water (25 mL), tetrahydrofuran (75 mL) and toluene (75 mL) were stirred in a 250 mL round-bottom flask for 12 hours under reflux. After completion of the reaction, the reaction mixture was cooled to room temperature and extracted with ethyl acetate (300 mL) and water (1000 mL). The organic layer was dried with magnesium sulfate and concentrated under reduced pressure. The resulting solid was dissolved in hot toluene (400 mL) and filtered. The filtrate was recrystallized in methanol (800 mL). The resultant solid was filtered and washed with hexane (300 mL) to obtain a product (26 g, 0.072 mol, 68.4%).

4-b. Synthesis of 1-hydroxy-4-{4-(naphthalen-2-yl)phenyl}naphthalene

1-Hydroxy-4-{4-(naphthalen-2-yl)phenyl}naphthalene was synthesized as follows.

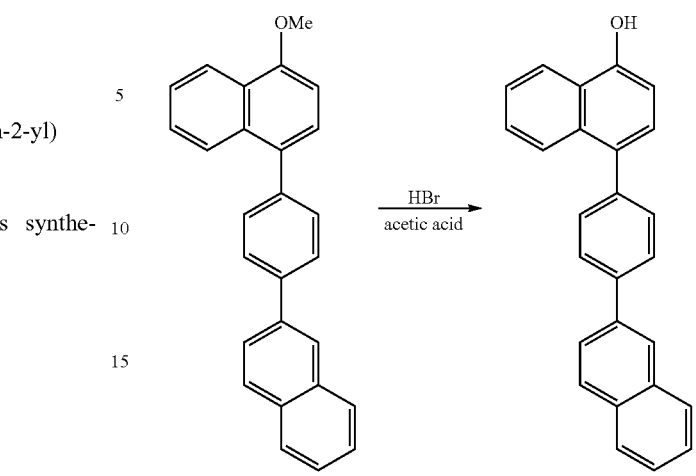

1-Methoxy-4-{4-(naphthalen-2-yl)phenyl}naphthalene (20 g, 0.055 mol), acetic acid (200 mL) and bromic acid (180 mL) were stirred in a 1 L round-bottom flask under reflux. After completion of the reaction, the reaction mixture was cooled to room temperature and water (200 mL) was added. After filtration, the resulting solid was dissolved in dichloromethane (1.2 L) and washed twice with water (400 mL). Column purification of the organic layer using dichloromethane followed by recrystallization using dichloromethane and hexane for 3 times yielded a product (11.5 g, 0.033 mol, 59.8%).

4-c. Synthesis of Compound of Formula 5

Compound of Formula 5 was synthesized as follows.

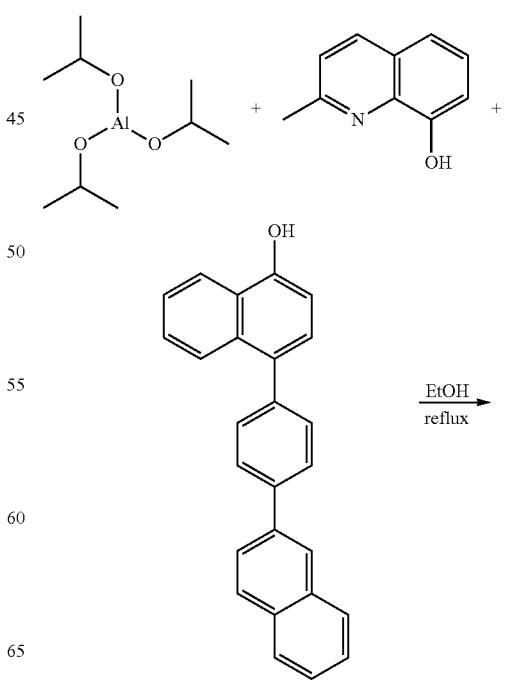

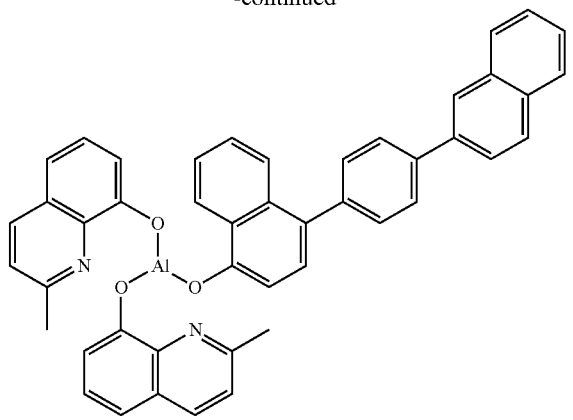

Aluminum propoxide (4.8 g, 0.024 mol), 1-hydroxy-4-{4-(naphthalen-1-yl)phenyl}naphthalene (8.1 g, 0.023 mol) and ethanol (192 mL) were stirred in a 500 mL round-bottom flask for 2 hours under reflux. After adding 2-methyl-8-quinolinol (7.5 g, 0.047 mol), the reaction mixture was stirred for 20 hours under reflux. After completion of the reaction, the reaction mixture was cooled to room temperature, filtered, and washed with ethanol. The resulting filtrate (11.4 g) was purified by sublimation for 3 times without chemical purification to obtain a product.

EA: Theoretical—C, 80.22%; H, 4.83%; N, 4.07%.
Actual—C, 81.14%; H, 4.96%; N, 4.25%.

Synthesis Example 5

Synthesis of compound of Formula 8

5-a. Synthesis of 1-methoxy-4-{3,5-(diphenyl)phenyl}naphthalene

1-Methoxy-4-{3,5-(diphenyl)phenyl}naphthalene was synthesized as follows.

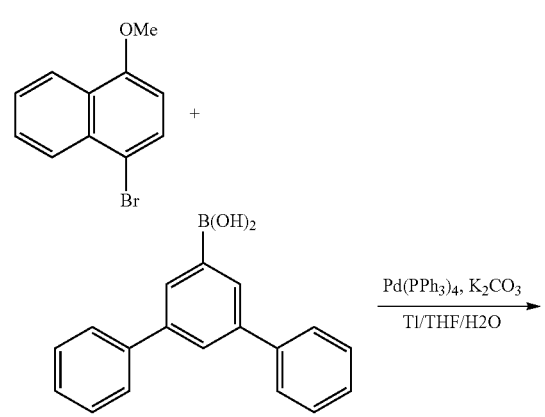

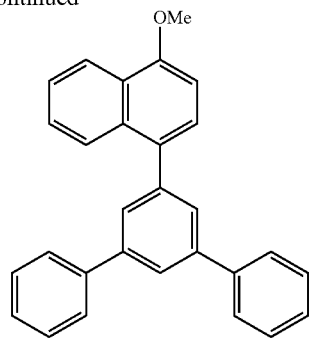

1-Bromo-4-methoxynaphthalene (25 g, 0.105 mol), 3,5-diphenylphenylboronic acid 37.6 g (0.137 mol), potassium carbonate (21.9 g, 0.16 mol), tetrakis(triphenylphosphine)palladium(0) (2.4 g, 0.01 mol), water (25 mL), tetrahydrofuran (75 mL) and toluene (75 mL) were stirred in a 250 mL round-bottom flask for 12 hours under reflux. After completion of the reaction, the reaction mixture was cooled to room temperature and extracted with ethyl acetate (500 mL) and water (600 mL). The organic layer was dried with magnesium sulfate and concentrated under reduced pressure. The resulting solid was dissolved in hot toluene (1000 mL) and filtered. The filtrate was concentrated and recrystallized in methanol (800 mL). The resulting solid was filtered and washed with hexane (300 mL) to obtain a product (23.5 g, 0.061 mol, 57.6%).

5-b. Synthesis of 1-hydroxy-4-{3,5-(diphenyl)phenyl}naphthalene

1-Hydroxy-4-{3,5-(diphenyl)phenyl}naphthalene was synthesized as follows.

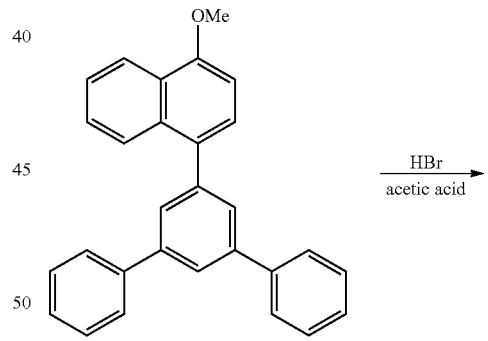

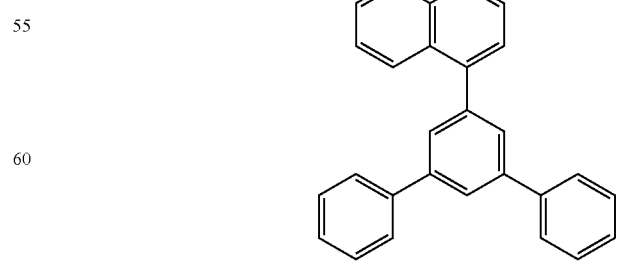

1-Methoxy-4-{3,5-(diphenyl)phenyl}naphthalene (20 g, 0.051 mol), acetic acid (200 mL) and bromic acid (180 mL)

were stirred in a 1 L round-bottom flask under reflux. After completion of the reaction, the reaction mixture was cooled to room temperature and water (200 mL) was added. The resulting solid was filtered, dissolved in dichloromethane (1 L), and washed twice with water (400 mL). Column purification of the organic layer using dichloromethane followed by recrystallization using dichloromethane and hexane for 3 times yielded a product (8.5 g, 0.023 mol, 44.1%).

5-c. Synthesis of Compound of Formula 8

Compound of Formula 8 was synthesized as follows.

Synthesis Example 6

Synthesis of Compound of Formula 33

6-a. Synthesis of 1-hydroxy-4-{3,5-(diphenyl)phenyl}naphthalene

1-Hydroxy-4-{3,5-(diphenyl)phenyl}naphthalene was synthesized as follows.

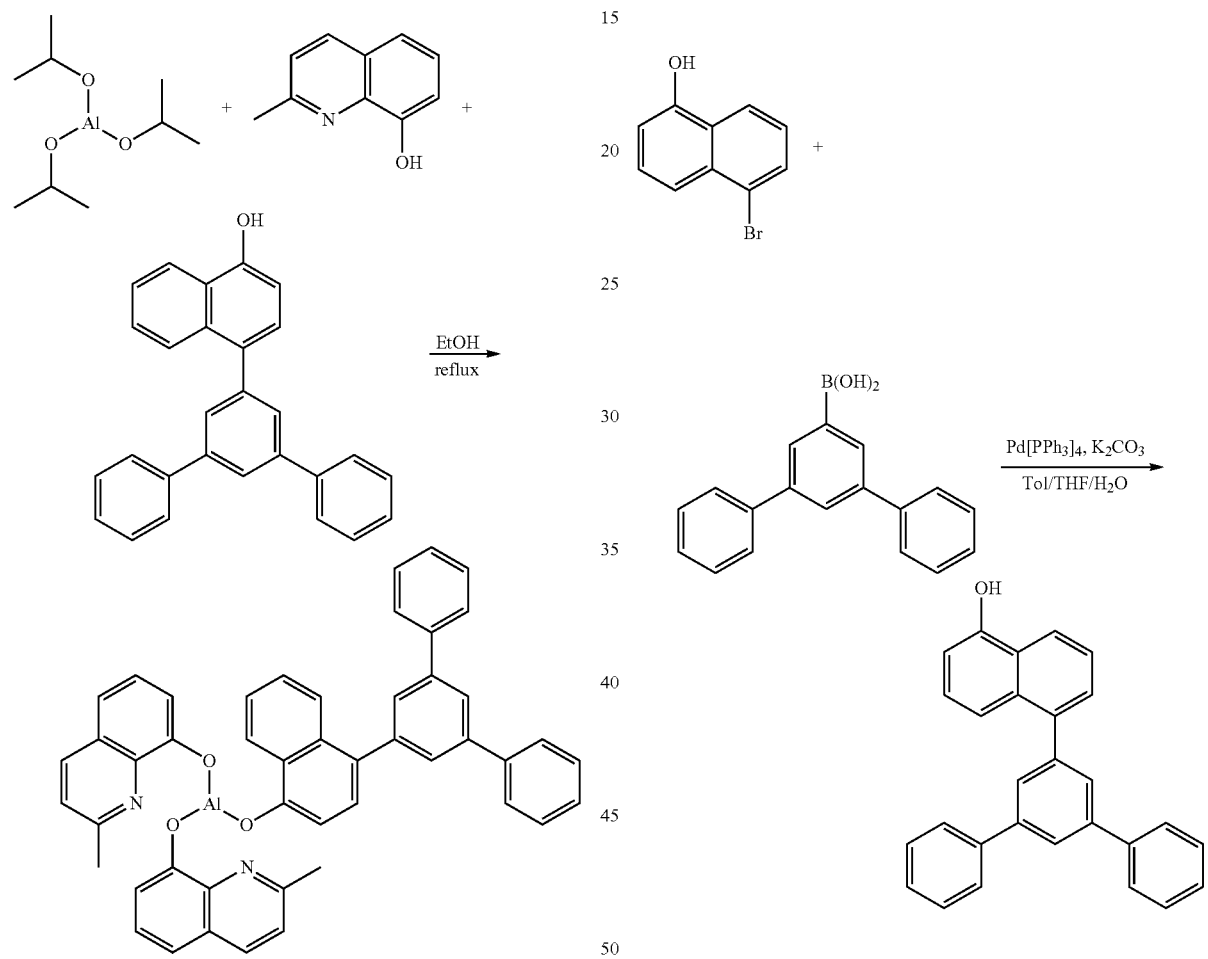

Aluminum propoxide (4.8 g, 0.024 mol), 1-hydroxy-4-{3,5-(diphenyl)phenyl}naphthalene (8.8 g, 0.023 mol) and ethanol (192 mL) were stirred in a 500 mL round-bottom flask for 2 hours under reflux. After adding 2-methyl-8-quinolinol (7.5 g, 0.047 mol), the reaction mixture was stirred for 20 hours under reflux. After completion of the reaction, the reaction mixture was cooled to room temperature, filtered and washed with ethanol. The resulting filtrate (12 g) was purified by sublimation for 3 times without chemical purification to obtain a product.

EA: Theoretical—C, 80.66%; H, 4.94%; N, 3.92%.
Actual—C, 81.21%; H, 4.93%; N, 3.88%.

1-Bromo-5-hydroxynaphthalene 30 g (0.134 mol), 3,5-diphenylphenylboronic acid 47.9 g (0.174 mol), potassium carbonate (27.9 g, 0.2 mol), tetrakis(triphenylphosphine)palladium(0) (3.1 g, 0.02 mol), water (30 mL), tetrahydrofuran (90 mL) and toluene (90 mL) were stirred in a 250 mL round-bottom flask for 12 hours under reflux. After completion of the reaction, the reaction mixture was cooled to room temperature and extracted with dichloromethane (2000 mL) and water (600 mL). The organic layer was dried with magnesium sulfate and concentrated under reduced pressure. Column purification using dichloromethane followed by recrystallization using dichloromethane and hexane for 3 times yielded a product (20 g, 0.054 mol, 39.9%).

6-b. Synthesis of Compound of Formula 33

Compound of Formula 33 was synthesized as follows.

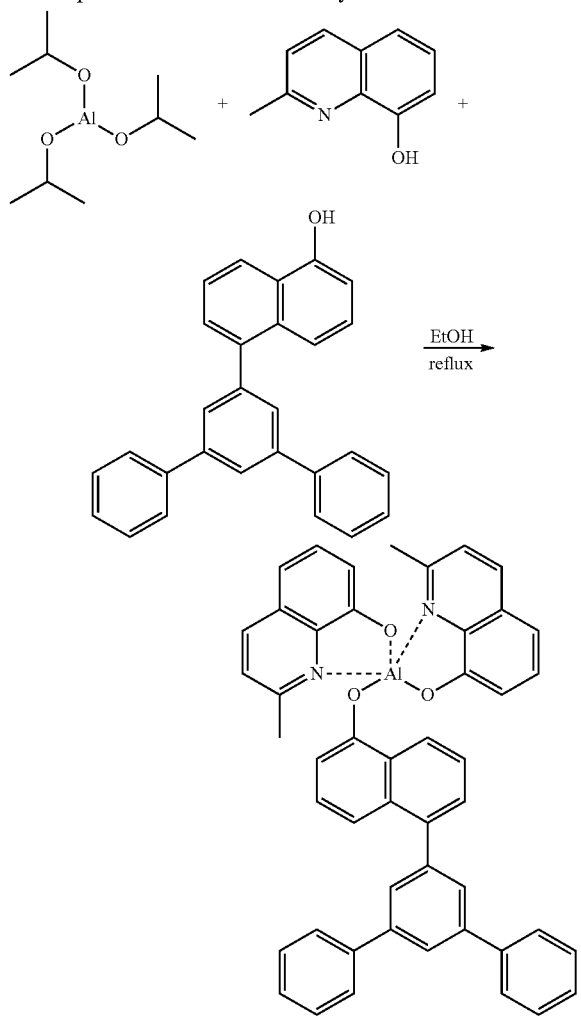

Aluminum propoxide (4.8 g, 0.024 mol), 1-hydroxy-5-{3, 5-(diphenyl)phenyl}naphthalene (8.8 g, 0.023 mol) and ethanol (192 mL) were stirred in a 500 mL round-bottom flask for 2 hours under reflux. After adding 2-methyl-8-quinolinol (7.5 g, 0.047 mol), the reaction mixture was stirred for 20 hours under reflux. After completion of the reaction, the reaction mixture was cooled to room temperature, filtered and washed with ethanol. The resulting filtrate (11.4 g) was purified by sublimation for 3 times without chemical purification to obtain a product.

EA: Theoretical—C, 80.66%; H, 4.94%; N, 3.92%.
Actual—C, 80.25%; H, 4.88%; N, 3.99%.

Examples 1-6

Fabrication of Organic Light-Emitting Diodes

Organic light-emitting diodes were fabricated using the compounds synthesized in Synthesis Examples 1-6. An ITO-deposited glass substrate was patterned to have a light-emitting area of 2 mm×2 mm, followed by cleaning. After the substrate was mounted in a vacuum chamber, the pressure of the chamber was adjusted to $1\times10^{-6}$ torr. CuPC (200 Å), NPD (400 Å), the compound prepared according to the present invention+RD-2 (7%) (200 Å), ET1 (300 Å), LiF (5 Å) and Al (1,000 Å) were deposited in this order on the ITO to form respective films. Measurement was made at 0.4 mA.

ET1, which was used as the electron transport layer material, has the following formula:

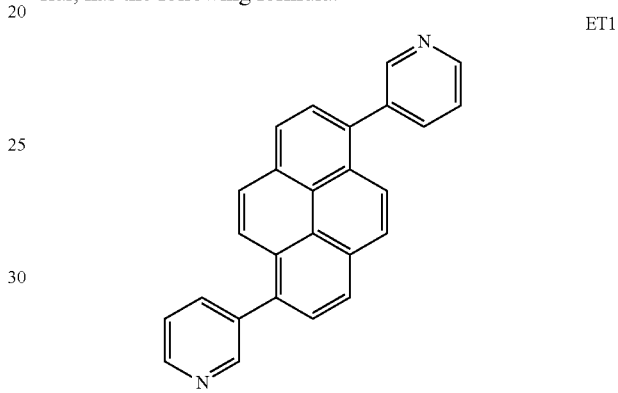

ET1

The LiF/Al electrode used in the fabrication of the organic light-emitting diode had a LUMO energy level of 3.4 eV (*Thin Solid Films* 453-454 (2004) 312-315), and the compounds according to the present invention have a LUMO energy level of about 2.8 eV. Accordingly, the inventors used ET1 (2.6 eV) instead of Alq3 (3.3 eV, *Chemistry of Materials*, 2002, 14, 2796-2802) commonly used as an electron transport material, in order to facilitate transport of electrons to the light-emitting layer, thereby enhancing luminescence efficiency and lowering driving voltage.

Comparative Example

An organic light-emitting diodes was fabricated in the same manner as Examples, except for using BAlq as the host material instead of the compounds prepared according to the present invention.

TABLE 1

| Ex. No. | Host | Dopant | Doping % | ETL | V | Cd/A | CIEx | CIEy | T80 |
|---|---|---|---|---|---|---|---|---|---|
| Comp. Ex. | BAlq | RD-2 | 7 | Alq3 | 6.6 | 10.9 | 0.63 | 0.36 | 819.7 |
| Ex. 1 | Formula 2 | RD-2 | 7 | Alq3 | 5.62 | 18.4 | 0.67 | 0.33 | 1145.7 |
| Ex. 2 | Formula 3 | RD-2 | 7 | Alq3 | 5.15 | 16.11 | 0.67 | 0.33 | 1038.1 |
| Ex. 3 | Formula 4 | RD-2 | 7 | Alq3 | 4.7 | 13.24 | 0.68 | 0.32 | 1136.4 |
| Ex. 4 | Formula 5 | RD-2 | 7 | Alq3 | 4.65 | 12.18 | 0.68 | 0.32 | 1090.7 |
| Ex. 5 | Formula 8 | RD-2 | 7 | Alq3 | 4.92 | 14.26 | 0.67 | 0.33 | 998.4 |
| Ex. 6 | Formula 10 | RD-2 | 7 | Alq3 | 5.33 | 15.85 | 0.67 | 0.33 | 1628.1 |

As can be seen from Table 1, the organic light-emitting diodes comprising the organometallic complexes according to the present invention as the host material exhibit better efficiency and lifetime properties, when A in Formula 1 is deuterium or substituted or unsubstituted phenyl, and significantly lower driving voltage by 1-2 V, when it is aryl-substituted phenyl, when compared to the organic light-emitting diode using BAlq as the host material. Thus, the light-emitting diode of the present invention will be useful display devices, lightings, or the like.

What is claimed is:

1. An organometallic complex represented by Formula 1:

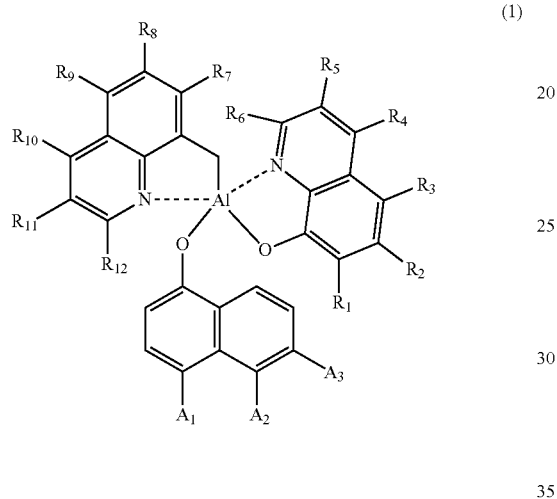

(1)

wherein each of $R_1$ to $R_{12}$ is independently selected from the group consisting of hydrogen, deuterium, halogen, substituted or unsubstituted $C_1$-$C_{12}$ alkyl, substituted or unsubstituted $C_6$-$C_{40}$ arylamino, substituted or unsubstituted $C_3$-$C_{40}$ aryloxy, substituted or unsubstituted $C_6$-$C_{40}$ aryl, substituted or unsubstituted $C_3$-$C_{40}$ heteroaryl, germanium, phosphorus and boron; and each of $A_1$ to $A_3$ is substituted or unsubstituted $C_6$-$C_{40}$ aryl excepting naphthalene, phenanthrene and anthracene, or hydrogen, and may be linked with each other to form a condensed ring.

2. The organometallic complex according to claim 1, wherein each of $R_1$ to $R_{12}$ and $A_1$ to $A_3$ may be independently substituted with a substituent selected from the group consisting of deuterium, cyano, halogen, hydroxy, nitro, $C_1$-$C_{40}$ alkyl, $C_1$-$C_{40}$ alkoxy, $C_1$-$C_{40}$ alkylamino, $C_6$-$C_{40}$ arylamino, $C_3$-$C_{40}$ heteroarylamino, $C_1$-$C_{40}$ alkylsilyl, $C_6$-$C_{40}$ arylsilyl, $C_6$-$C_{40}$ aryl, $C_3$-$C_{40}$ aryloxy, $C_3$-$C_{40}$ heteroaryl, germanium, phosphorus and boron, and the substituent may be linked with each other to form an aliphatic, aromatic, heteroaliphatic or heteroaromatic condensed ring.

3. The organometallic complex according to claim 1, wherein $A_1$ is substituted or unsubstituted phenyl.

4. The organometallic complex according to claim 1, wherein the organometallic complex is selected from the following compounds represented by Formulae 2 to 43:

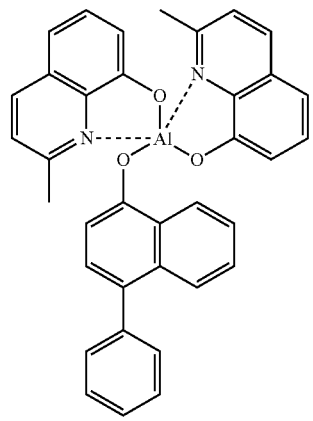

(2)

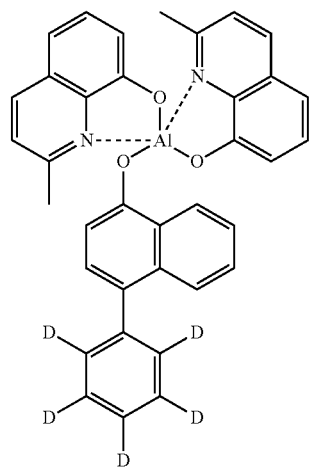

(3)

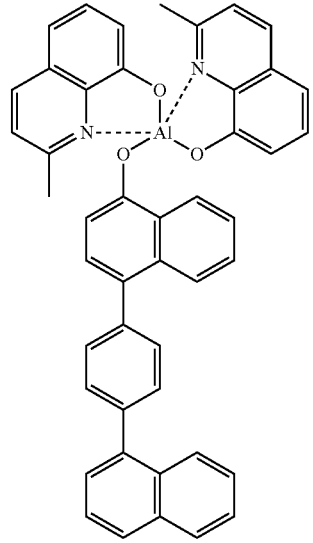

(4)

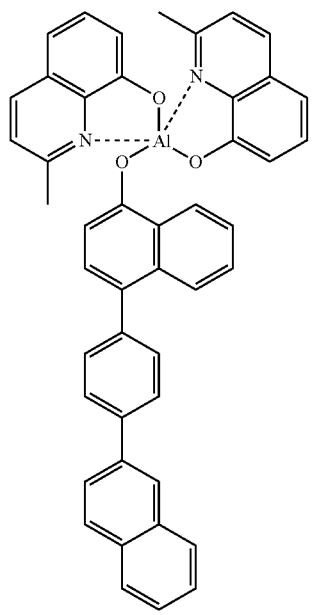
(5)
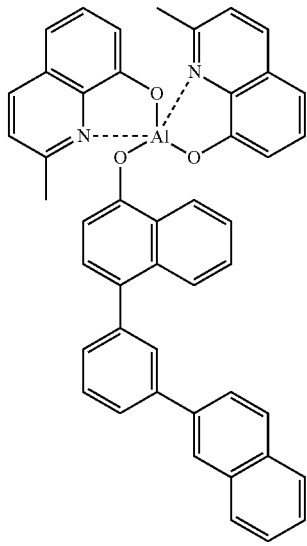
(7)
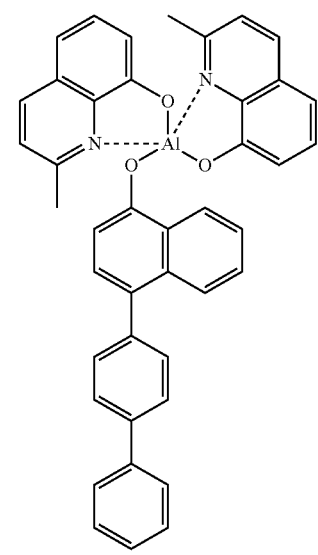
(8)
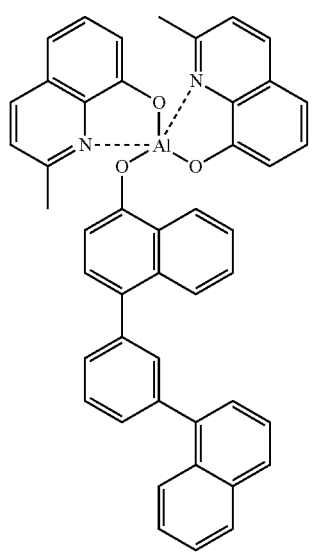
(6)
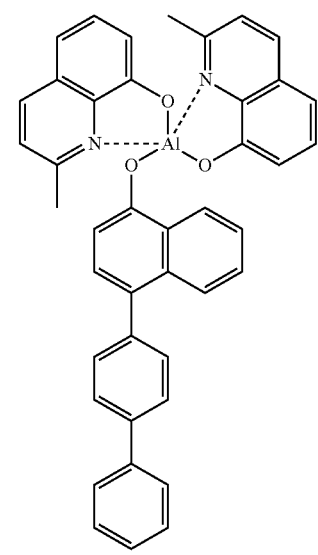
(9)

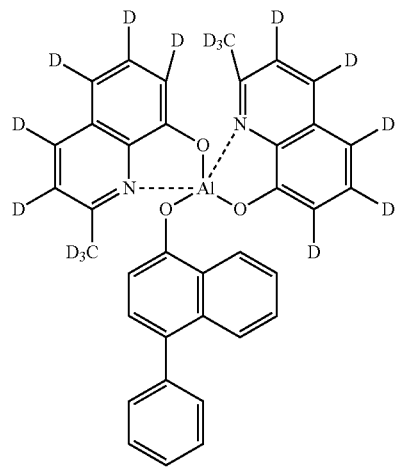
(10)
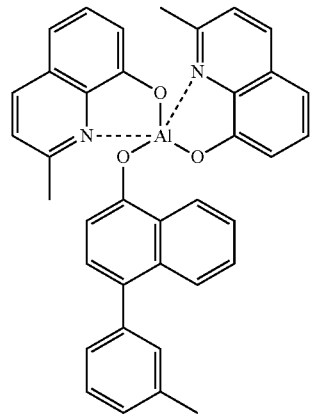
(13)
(11)
(14)
(12)
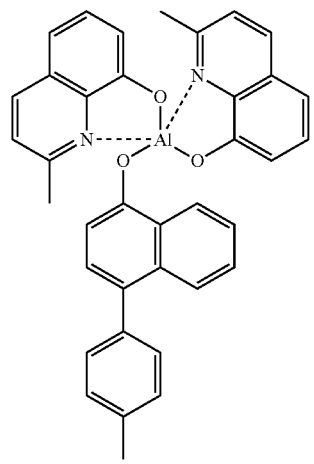
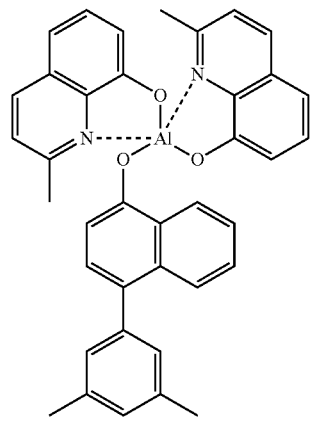
(15)

(16)
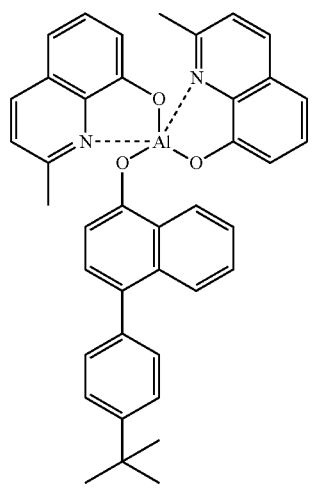
(17)
(18)
(19)
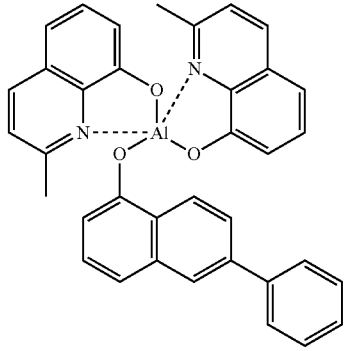
(20)
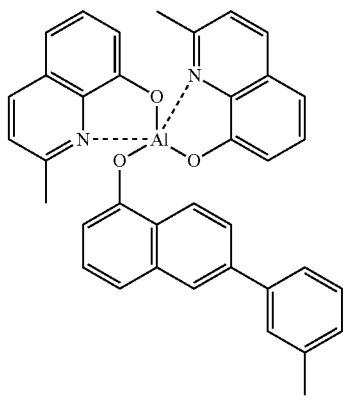
(21)
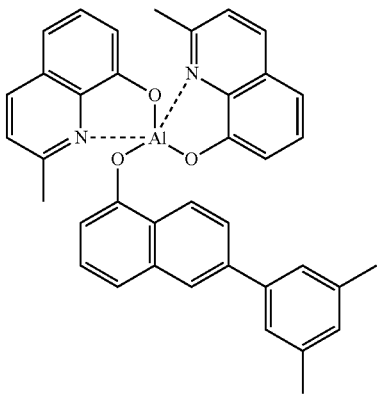
(22)
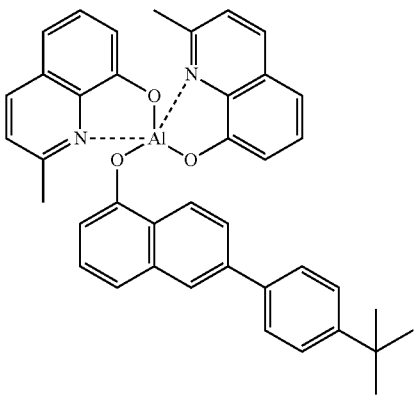

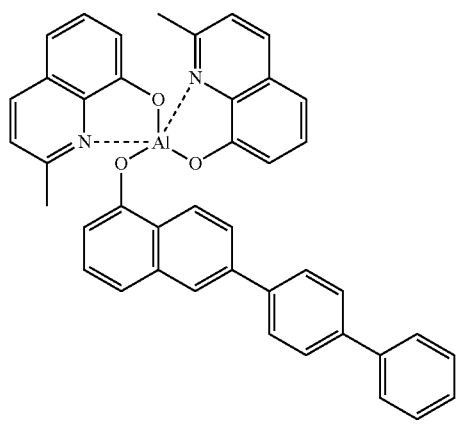
(23)
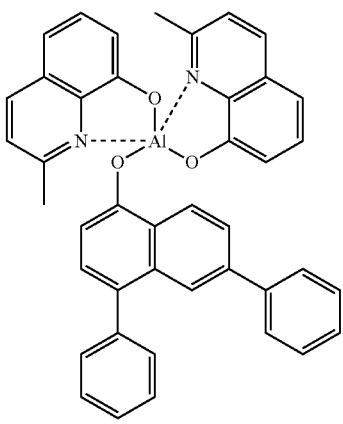
(26)
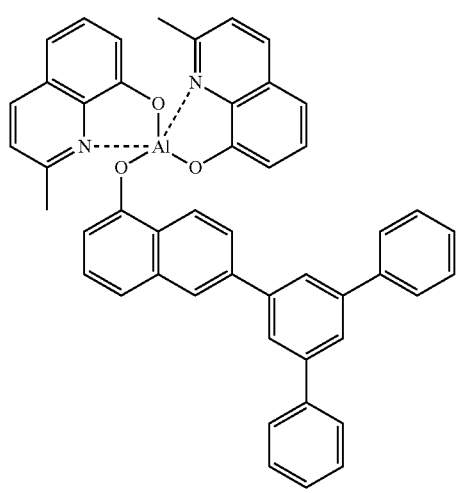
(24)
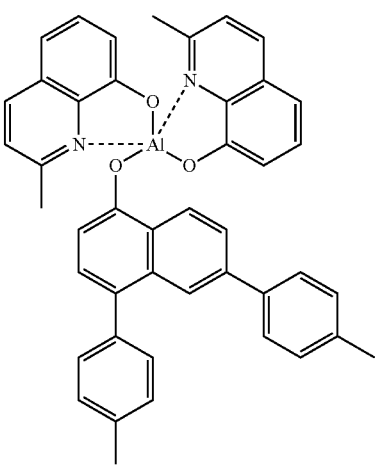
(27)
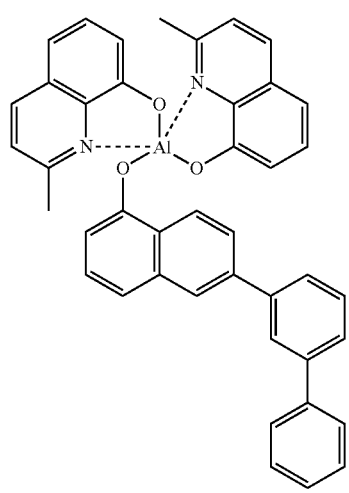
(25)
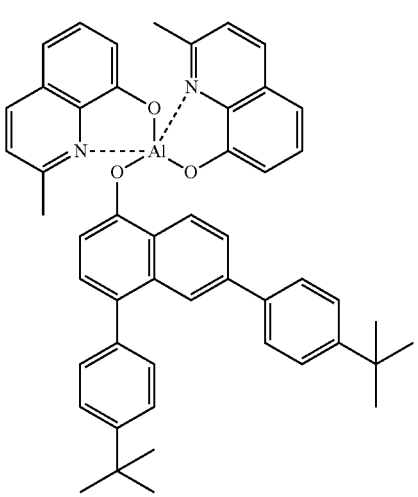
(28)

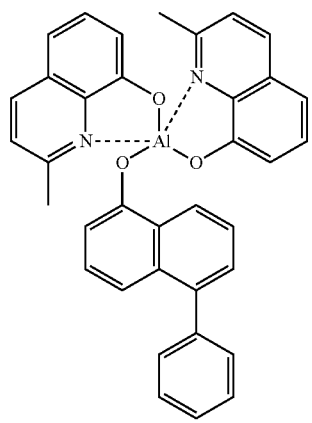
(29)
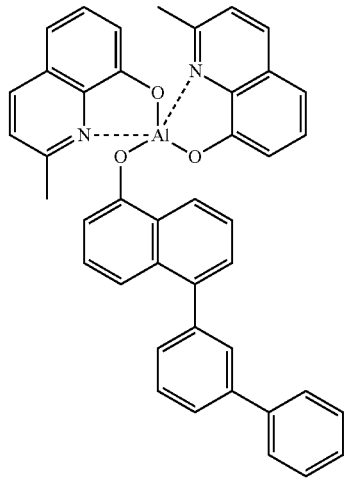
(32)
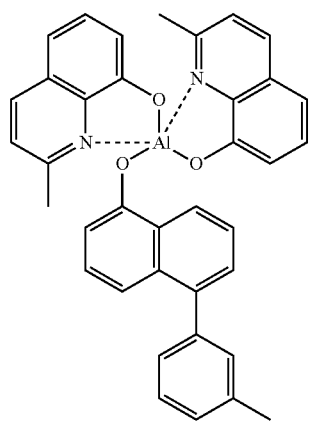
(30)
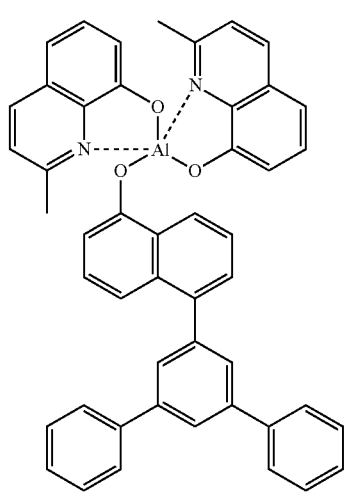
(33)
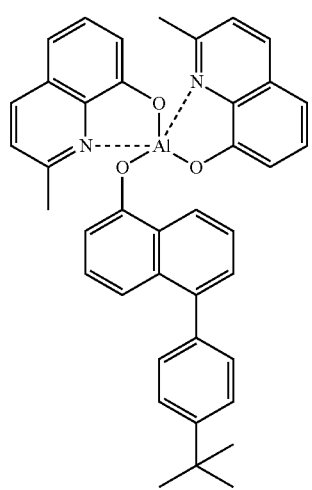
(31)
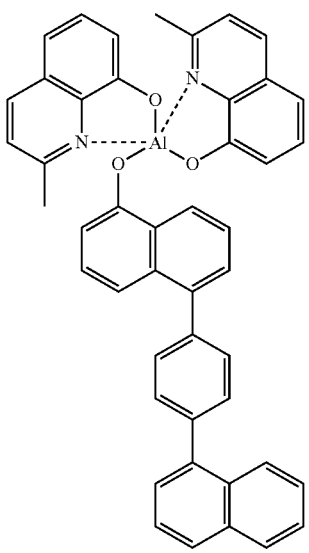
(34)

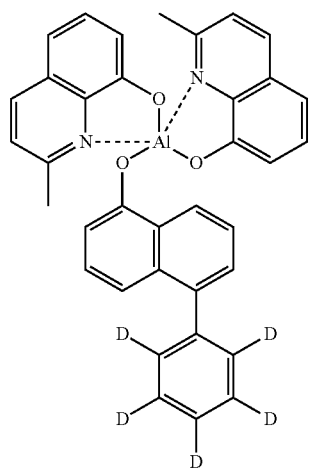 (35)
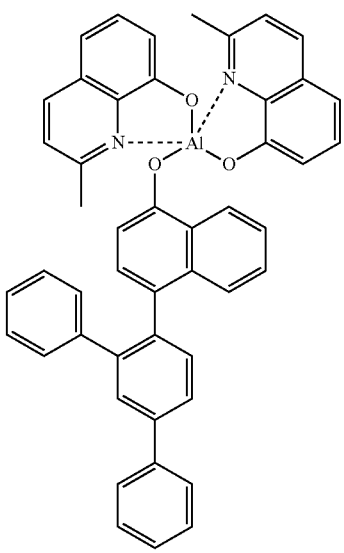 (38)
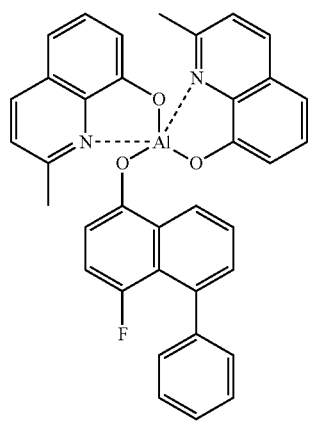 (36)
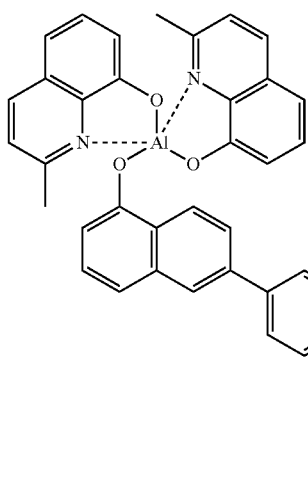 (39)
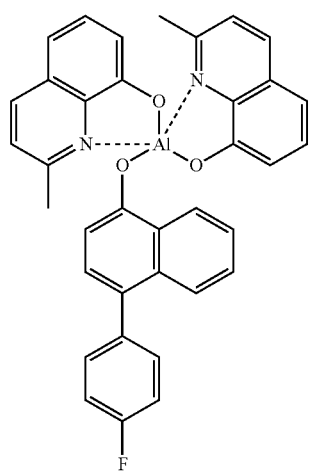 (37)
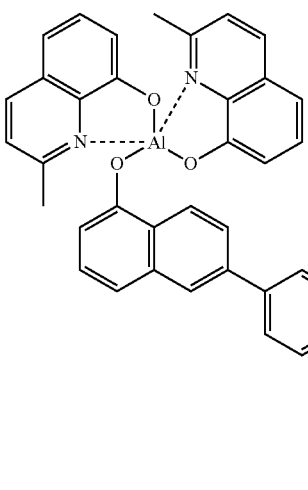 (40)

-continued

(41) 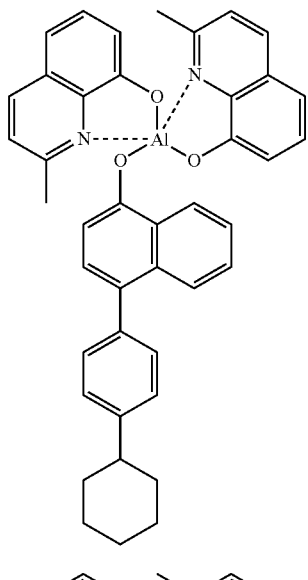

(42) 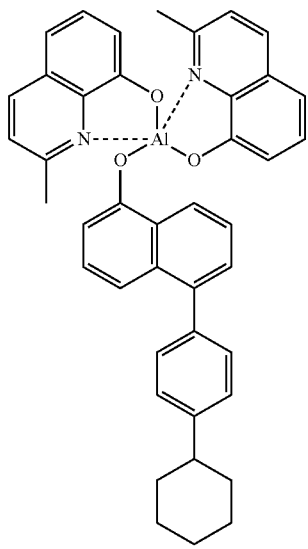

(43) 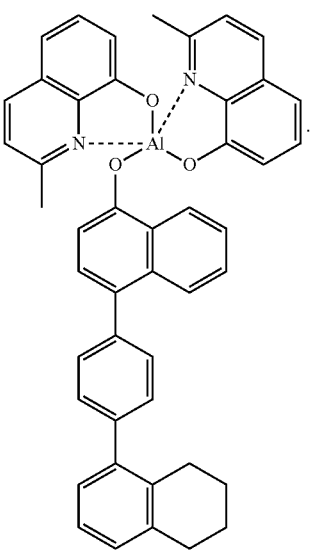

5. An organic light-emitting diode comprising:
an anode;
a cathode; and
a layer disposed between the anode and the cathode and including the organometallic complex according to claim 1.

6. The organic light-emitting diode according to claim 5, further comprising one or more layer(s) selected from the group consisting of a light-emitting layer, a hole injecting layer, a hole transport layer, an electron blocking layer, a hole blocking layer, an electron transport layer and an electron injecting layer, between the anode and the cathode.

7. The organic light-emitting diode according to claim 6, wherein the organometallic complex is included in the light-emitting layer between the anode and the cathode.

8. The organic light-emitting diode according to claim 7, which further comprises an iridium complex as a dopant of the light-emitting layer.

9. The organic light-emitting diode according to claim 8, wherein the iridium complex is represented by Formula RD-1 or RD-2:

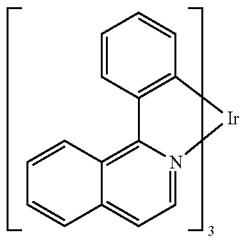
(RD-1)

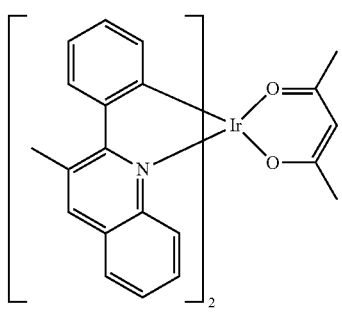
(RD-2)

10. The organic light-emitting diode according to claim 9, wherein the dopant is used in an amount of 0.1 to 30% by weight of the organometallic complex.

* * * * *